(12) United States Patent
Louise et al.

(10) Patent No.: US 8,502,821 B2
(45) Date of Patent: Aug. 6, 2013

(54) SYSTEM FOR THREE-DIMENSIONAL RENDERING OF ELECTRICAL TEST AND MEASUREMENT SIGNALS

(75) Inventors: Justin Ralph Louise, Jamesville, NY (US); Kevin Roy Francis, Liverpool, NY (US); David James Yaw, Liverpool, NY (US)

(73) Assignee: C Speed, LLC, Liverpool, NY (US)

( * ) Notice: Subject to any disclaimer, the term of this patent is extended or adjusted under 35 U.S.C. 154(b) by 983 days.

(21) Appl. No.: 12/012,617

(22) Filed: Feb. 4, 2008

(65) Prior Publication Data

US 2009/0195536 A1 Aug. 6, 2009

(51) Int. Cl.
*G06T 11/20* (2006.01)
*G06T 15/00* (2011.01)

(52) U.S. Cl.
CPC .............. *G06T 11/206* (2013.01); *G06T 11/203* (2013.01); *G06T 15/00* (2013.01)
USPC ........... 345/440; 345/419; 345/422; 381/102; 381/80; 702/66; 702/67

(58) Field of Classification Search
CPC ........ G06T 11/206; G06T 11/203; G06T 15/00
USPC ................... 345/440, 419, 422; 381/102, 80; 702/66, 67
See application file for complete search history.

(56) References Cited

U.S. PATENT DOCUMENTS

| | | | |
|---|---|---|---|
| 3,638,066 A | 1/1972 | Paine et al. | |
| 3,769,541 A | * | 10/1973 | Wood .............................. 315/384 |
| 4,032,912 A | 6/1977 | Wood | |
| 4,292,977 A | 10/1981 | Krause et al. | |
| 4,818,931 A | 4/1989 | Naegeli et al. | |
| 4,961,155 A | * | 10/1990 | Ozeki et al. .................... 702/152 |

(Continued)

FOREIGN PATENT DOCUMENTS

WO WO 2004059334 A1 * 7/2004
WO WO 2005/121814 A1 12/2005

OTHER PUBLICATIONS

LeCroy Corporation, MS Series Mixed Signal Oscilloscopes, 2007.

(Continued)

*Primary Examiner* — Javid A Amini
(74) *Attorney, Agent, or Firm* — Kenneth J. Lukacher Law Group

(57) ABSTRACT

The system for three-dimensional rendering of signals has a computer system having acquired, streaming, or previously stored data in its memory representing multiple channels of signals in which each channel has a value which varies over a domain, e.g., time or frequency, and a display coupled to the computer. For each channel, the computer system segments the data of the channel into segments, orders the segments, renders on the display each of the segments, in which each of the rendered segments are aligned in such order along a three-dimensional perspective with gaps between adjacently rendered segments, and lines are rendered extending from each line of each one of the rendered segments to form a three-dimensional plane in the gap to the next successive one of the rendered ordered segments to form a three-dimensional continuous or discontinuous surface characterizing the channel. The surfaces of each of the channels are aligned on the display, and may be of different color, shading, and translucency, whereby channels of overlaid surfaces are viewable on the display.

25 Claims, 36 Drawing Sheets

U.S. PATENT DOCUMENTS

| | | | |
|---|---|---|---|
| 5,214,508 A | 5/1993 | Stevens | |
| 5,241,302 A | 8/1993 | Thong | |
| 5,280,542 A * | 1/1994 | Ozeki et al. | 382/154 |
| 5,739,807 A | 4/1998 | Thong | |
| 5,801,312 A * | 9/1998 | Lorraine et al. | 73/602 |
| 5,959,607 A * | 9/1999 | Montijo | 345/440.1 |
| 5,960,118 A | 9/1999 | Briskin et al. | |
| 6,137,749 A | 10/2000 | Sumner | |
| 6,151,010 A * | 11/2000 | Miller et al. | 345/440.1 |
| 6,442,730 B1 | 8/2002 | Schachner et al. | |
| 6,707,474 B1 * | 3/2004 | Beck et al. | 715/771 |
| 6,735,554 B2 | 5/2004 | Guenther | |
| 6,741,887 B1 * | 5/2004 | Gleeson | 600/523 |
| 6,745,148 B2 | 6/2004 | Abramovitch | |
| 6,810,346 B2 * | 10/2004 | Nygaard et al. | 702/117 |
| 6,963,999 B2 * | 11/2005 | Kondo et al. | 714/701 |
| 6,965,383 B2 | 11/2005 | Ritter et al. | |
| 7,103,400 B2 * | 9/2006 | Ossmann et al. | 600/428 |
| 7,216,046 B2 * | 5/2007 | Agoston et al. | 702/70 |
| 7,456,779 B2 * | 11/2008 | Cross et al. | 342/25 A |
| 8,018,468 B2 * | 9/2011 | Matsumoto et al. | 345/589 |
| 2003/0006990 A1 * | 1/2003 | Salant et al. | 345/440.1 |
| 2003/0036864 A1 * | 2/2003 | Randall et al. | 702/79 |
| 2003/0058243 A1 * | 3/2003 | Faust et al. | 345/440 |
| 2003/0063097 A1 | 4/2003 | Prabhakar et al. | |
| 2004/0017371 A1 * | 1/2004 | Shen et al. | 345/440 |
| 2004/0017399 A1 * | 1/2004 | Beck et al. | 345/805 |
| 2004/0123191 A1 | 6/2004 | Salant et al. | |
| 2005/0183066 A1 | 8/2005 | Jabori | |
| 2005/0234670 A1 * | 10/2005 | Hagen et al. | 702/85 |
| 2006/0055698 A1 | 3/2006 | Ritter | |
| 2006/0075212 A1 * | 4/2006 | Cheng et al. | 712/227 |
| 2006/0079772 A1 * | 4/2006 | Ichikawa et al. | 600/437 |
| 2006/0178850 A1 * | 8/2006 | Kobayashi | 702/89 |
| 2006/0294441 A1 | 12/2006 | Cheng et al. | |
| 2007/0018985 A1 * | 1/2007 | Campiche et al. | 345/440 |
| 2007/0046952 A1 | 3/2007 | Kikuchi | |
| 2007/0061629 A1 * | 3/2007 | Thums et al. | 714/39 |
| 2007/0167805 A1 * | 7/2007 | Clement | 600/459 |
| 2007/0182015 A1 * | 8/2007 | Kornilovich et al. | 257/761 |
| 2008/0074312 A1 * | 3/2008 | Cross et al. | 342/25 A |
| 2008/0285819 A1 * | 11/2008 | Konofagou et al. | 382/128 |
| 2008/0310200 A1 * | 12/2008 | Maksimovic et al. | 363/65 |
| 2009/0061730 A1 * | 3/2009 | Chen | 450/39 |
| 2009/0167595 A1 * | 7/2009 | Cross et al. | 342/25 A |
| 2009/0221916 A1 * | 9/2009 | Konofagou et al. | 600/443 |
| 2010/0077178 A1 * | 3/2010 | Crosetto | 712/29 |

OTHER PUBLICATIONS

OpenGL(R) Reference Manual: The Official Reference Document to OpenGL, Version 1.4 (4th Edition) (OpenGL), 2004.

OpenGL (R) Programming Guide: The Official Guide to Learning OpenGL (R), Version 2 (5th Edition) (OpenGL) 2006.

* cited by examiner

☐ DIGITAL SAMPLE DATA

▨ DIGITAL SAMPLE THAT MATCHES USER SELECTABLE CONDITION

☐ DIGITAL SAMPLE DATA

SYSTEM FOR THREE-DIMENSIONAL RENDERING OF ELECTRICAL TEST AND MEASUREMENT SIGNALS

FIELD OF THE INVENTION

This present invention relates to a system (method) for three-dimensional (3-D) rendering of test and measurement signals, and relates particularly to a system for three-dimensional rendering of test and measurement signals having a computer system, or other microprocessor based platform or system which produces three-dimensional surfaces representing multiple signal channels on a display in accordance with data acquired, streaming, or previously stored in memory of the computer system. The system is useful for three-dimensional visualization of the relationship between different channels of signals with user control of three-dimensional viewing position and angle to improve signal analysis over traditional two-dimensional display of test and measurement signals. Although the system is described herein for test and measurement signals, other signals that are variable over a domain which either are in, or are separable into, multiple channels, may also be visualized by the computer system as 3-D surfaces.

BACKGROUND OF THE INVENTION

In the field of test and measurement, a device typically collects sample data from one or more electrical test points over some period of time, whereby the value of a sample represents the voltage level of the given test point at a specific point in that timeline. Samples collected in one time-contiguous sequence are commonly considered as a single acquisition. Common tools in this field today include logic analyzers and digital storage oscilloscopes, such as those manufactured by Agilent Technologies, Tektronix Inc., and LeCroy Corp. These systems typically have a dedicated hardware platform, an attached personal computer coupled to the logic analyzer, or a digital storage oscilloscope, operating in accordance with software that can collect, store, and manipulate the data representing sample data over one or more signal channels, and renders such to the user in a pseudo real-time or non real-time fashion on a display. These systems commonly display the data to the user on the display as a two-dimensional graph, whereby the x-axis represents time, and the y-axis value describes the voltage of the test point at that time for a particular signal channel, as illustrated for example in FIG. 1. The user relies on this data representation to gain insight into the operation of the unit under test, thereby allowing detection of errors, anomalies, or proof that the device is operating properly.

Although the typical two dimensional voltage versus time graph is useful for showing one sample per channel per column of pixels on the display, variations in repetitive waveforms over time are difficult to discern. Further, as devices under test become more complex and the number of channels in acquisition devices available to the user rises, the sampling rates of signals by acquisition devices results in a huge amount of data over multiple channels in the memory of the computer system or digital oscilloscope storing such data. As a result, it becomes problematic to render the large amount of data from multiple channels in test and measurement systems all at once on a display to the viewer in a meaningful manner, thereby making it more difficult for the user to visualize and identify data of interest at a particular channel, and especially among multiple channels.

Approaches to improve rendering of two-dimensional voltage time graphs are described for example in U.S. Pat. Nos. 6,151,010 and 7,216,046, which enables common persistence modes via overlays or density maps of a channel on a digital oscilloscope. A drawback of this approach is that it is difficult to obverse patterns occurring in the channel. In U.S. Patent Application No. 2003/0006990, a digital oscilloscope displays waveform variations over time as a surface map graph. Such rendering is limited to a single channel at a time without correlation with any other channels. U.S. Patent Application Publication No. 2005/0234670 describes viewing multiple channels, domains, or acquisitions simultaneously, but does not provide for a display of multiple channels and acquisitions (or domains) simultaneously in a single three-dimensional view on a display. Further, the systems described in the above cited patents and publication have limited flexibility in the organization and presentation of the data on a display, which restricts the user's ability to quickly visualize and compare data when analyzing complex systems.

SUMMARY OF THE INVENTION

Accordingly, it is an object of the present invention to provide an improved system for rendering test and measurement data representing multiple channels which readily enables visualization of multiple channels in a three-dimensional (3-D) perspective as continuous or discontinuous surfaces aligned on a display in which the user can observe the relationships between different channels.

It is another object of the present invention to provide an improved system for rendering test and measurement data of multiple channels as continuous or discontinuous surfaces in three-dimensional perspective on a display in which a user can control one or more of the viewing position and angle with respect to the three-dimensional surfaces representing the channels to move in, around, or along the surfaces in all three dimensions to visualize data of interest.

Still another object of the present invention is to provide an improved system for rendering test and measurement data of multiple channels as continuous or discontinuous surfaces in three-dimensional perspective on a display, in which the data can represent real-time data for a device or system under test or stored data accessible to the system.

A yet further object of the present invention is to provide an improved system for rendering test and measurement data of multiple channels as continuous or discontinuous surfaces in three-dimensional perspective on a display, in which the rendering may smoothly change from a three-dimensional view to an orthogonal or two-dimensional view, and vice versa Briefly described, the present invention embodies a system having a computer (or other microprocessor based platform or system) having memory with acquired, streaming, or previously stored, data representing multiple channels of signals in which the signals of each channel has a value (y) which varies over time (x), and a display coupled to the computer. For each channel, the computer system segments the data of the channel into segments, orders the segments, renders on the display each of the segments as one or more lines in accordance with consecutive values of the data associated with the segment, in which each of the rendered segments are aligned in their order in depth (z) along a three-dimensional perspective with gaps between adjacently rendered segments, and lines are rendered extending from each line of each one of the rendered segments to form a three-dimensional plane in the gap to the next successive one of the rendered ordered segments to form a three-dimensional continuous or discontinuous surface characterizing the channel. The surface of each of the channels are aligned on the display preferably for enabling a user to view relationships of two or more different channels.

For each channel surface, the edges of two or more adjacent planes of the surface that are located along the same two of the three-dimensions may appear joined to each other as a common plane, and when two planes meet along different ones of at least two of the three-dimensions such two planes may appear to meet to form an edge.

Each channel is preferably rendered as a surface having a different color on the display to distinguish the channels from each other, rendered with shading (or gradients along surface depth and between varied signal values) to enhance a three-dimensional view of surfaces, and/or a degree of translucency to enable viewing (and discernment) of the channel or different channel(s) when overlaid on the display.

The computer system segmentation of the data of each of the channels is in accordance with segment start and/or stop conditions which are predefined or user defined. The ordering of segments for each of the channels may be in accordance with predefined or user defined conditions, or the order of the segments of the channel is defined by order in which the segments are segmented. The number of segments rendered for each of the channels on the display may also be predefined or user defined condition.

In one embodiment, when additional (or newer) signal data for one or more of the channels is received by the system, the ordered segments rendered on the display for each of such one or more channels advances in the depth (z) in the three-dimensional perspective as the computer system continues to segment the data representing the signal of the channel into segment, and then render such segments with planes extending from one or more lines thereof as an addition to the surface of the channel on the display. Consequently, as each of such one or more channels advance in depth with the addition of new ordered segments, the rendered segments and planes extending from one or more lines thereof associated with the oldest segment(s) may be removed from the view, thereby providing a smoothly flowing view of multiple signal channels in a three-dimensional view whereby newer to older segments of each signals channel are viewable as a scrolling, aging surface in a perspective of depth.

In another embodiment, the computer system upon detection of a specified condition predefined by the user within the data of any one or more of the channels may adjust or add to the number of surfaces displayed by rendering new surface(s) on the display aligned with other surfaces by segmenting and rendering in accordance with subset(s) of the data associated with such condition. Consequently, as new signal data is acquired the depth (z) in the three-dimensional perspective for one or more of rendered surfaces, the computer system may adjust (add/remove) by a varying number of rendered surfaces dependent on the number of occurrences of a specified condition within newly acquired or previously acquired data.

The computer system has user controls, such as a keyboard, mouse, touch screen surface upon the display, or the like, enabling the user to manipulate his/her view of the three-dimensional model representing the signal channels, such as for e.g., changing the viewing position from which the rendered surfaces are oriented (or centered) such that the user can select the angle of view of the model in, around, or along the model in all three dimensions.

The data representing the multiple signals may be from an acquisition device that is coupled by leads to a unit or device under test, where the acquisition device provides the data in near real-time to the computer system for processing into a three-dimensional view, or the data may be provided in real-time from the acquisition device, or such data may be any data representing multiple signals in memory stored or accessible to computer.

The present invention also provides a method for visualizing in a three-dimensional view having the steps of: segmenting the data of a channel into segments in which each of the segments starts at a predefined or user defined condition, ordering the segments, and rendering on a display each of the segments as one or more lines in accordance with the values of the data associated with the segment, in which each of the rendered segments are aligned in the order on the display along a three-dimensional perspective with gaps between adjacently rendered segments, and each line of each one of the rendered segments extends to form a three-dimensional plane in the gap to the next successive one of the rendered ordered segments to form a three-dimensional continuous or discontinuous surface characterizing the channel. The surface rendered represents one of a plurality of surfaces rendered on the display aligned with each other in which each of the plurality of surfaces are provided by carrying out the segmenting, ordering, and rendering steps on data representing each one of the channels.

An advantage of the present invention over traditional two-dimensional viewing of test and measurement data is that the user is able to request the system to organize and display the data in ways that lead to quick comparison and identification of problems that are not easily discernable via a two-dimension view. For example, take an acquisition with a complex repetitive (over time) pattern in it. With a conventional two-dimensional logic analyzer display, as shown for example in FIG. 1, the user must either condense the time scale of the graph (zoom out in time) losing most of the detailed data, or scroll back and forth left and right to see if any of the instances of the pattern deviate in any detail from the expected. This is extremely difficult because there is no way to directly compare the occurrences with details on the screen at the same time. With the present system the user can separate and reorganize each repetition of the pattern along the z dimension (depth) at a continuous or discontinuous surface viewed in three-dimensions. By providing any possible view around, along, or inside this model, a variation in any one of the repetitions in any channel(s) is quickly identifiable from the norm. An analogy to this would be searching a group of hole-punched pages to find if, and which ones, might contain holes that are misaligned. Laid out next to each other on a long table, examining the sheets to find differences could take very long or completely miss them. Instead, if the sheets are stacked on top of each other, any variances can be quickly identified.

The terms "orthogonal" and "two-dimensional" or "2-D" are used herein synonymously. While orthogonal refers to an orthogonal projection view and is technically still a view of a 3-D representation but with zero perspective applied, the resulting image appears to the user to be a "flat" 2-D rendering. Thus in this invention when the 3-D representation is viewed orthogonally from a perpendicular vantage point it becomes indiscernible from a 2-D graph.

Although the system and method of the present invention are described in connection with test and measuring electrical signals in the time domain, the system and method may operate to visualize signals in other domains, such a frequency domain, or from other sources. For example, the signals may be associated with or represent other forms of data such as a stream of video for analysis of frames thereof for anomalies, or signals from any sources that are variable over a domain (not limited to test and measuring electrical signals) which a user desires to visualize that can be captured and stored in memory of the computer system.

DETAILED DESCRIPTION OF THE DRAWINGS

The foregoing objects, features and advantages of the invention will become more apparent from a reading of the following description in connection with the accompanying drawings, in which.

Figure 1:
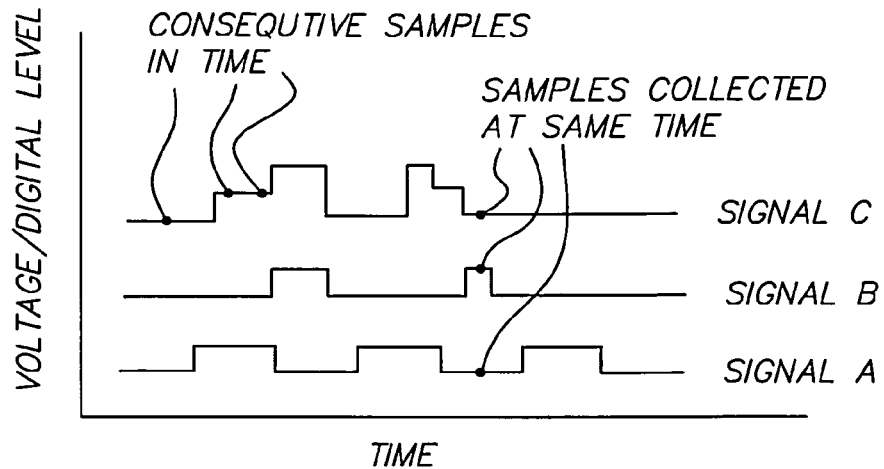
FIG. 1 is an example of the output rendered on the display of a typical logic analyzer or digital oscilloscope where x axis is time and y axis is the value (amplitude or voltage level)
Figure 2:
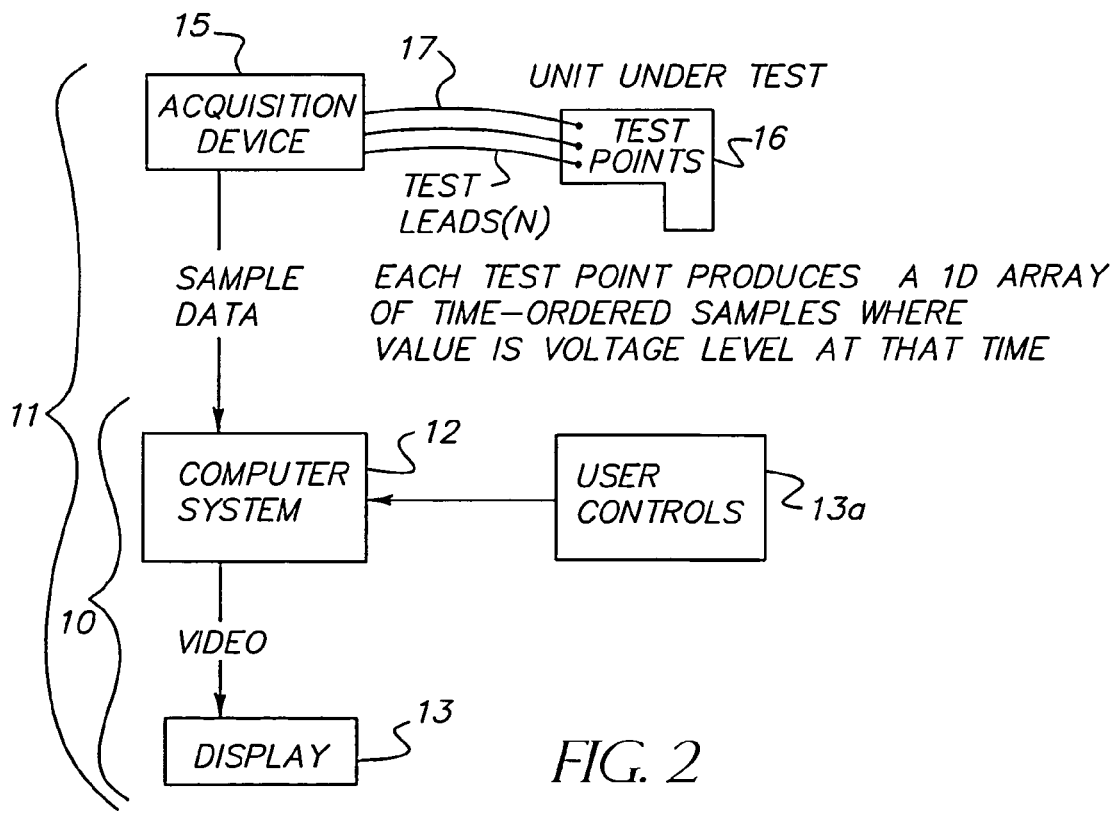
FIG. 2 is a block diagram of the system of the present invention in which the computer system operates in accordance with software for enabling three-dimensional rendering of data representing multiple signal channels on a display.
Figure 4:
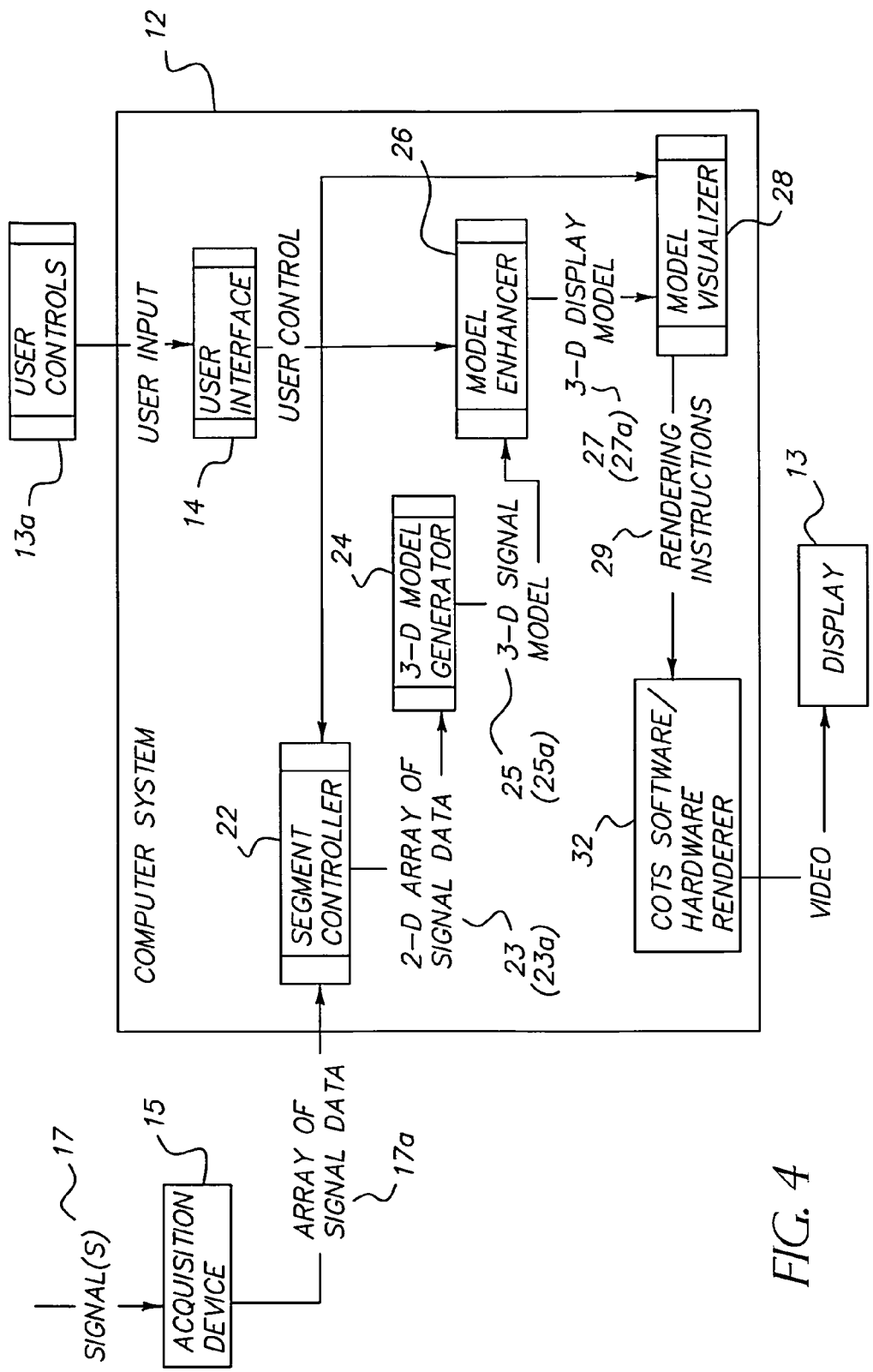
FIG. 4 is block diagram of the modules of the software operating on the computer system of FIG. 2.
Figure 6A:
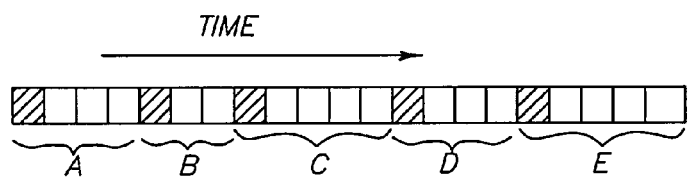
FIG. 6A is an illustration showing an example of selection of segments by segment controller module of FIG. 4 from a time-contiguous series of composite samples based on a user selectable condition.
Figure 6B:
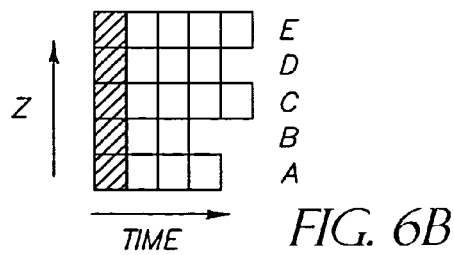
FIG. 6B is an example of a two-dimensional array ordering by the segment controller module of FIG. 4 of segments along z from most earlier to later of those selected in FIG. 6A.
Figure 7:
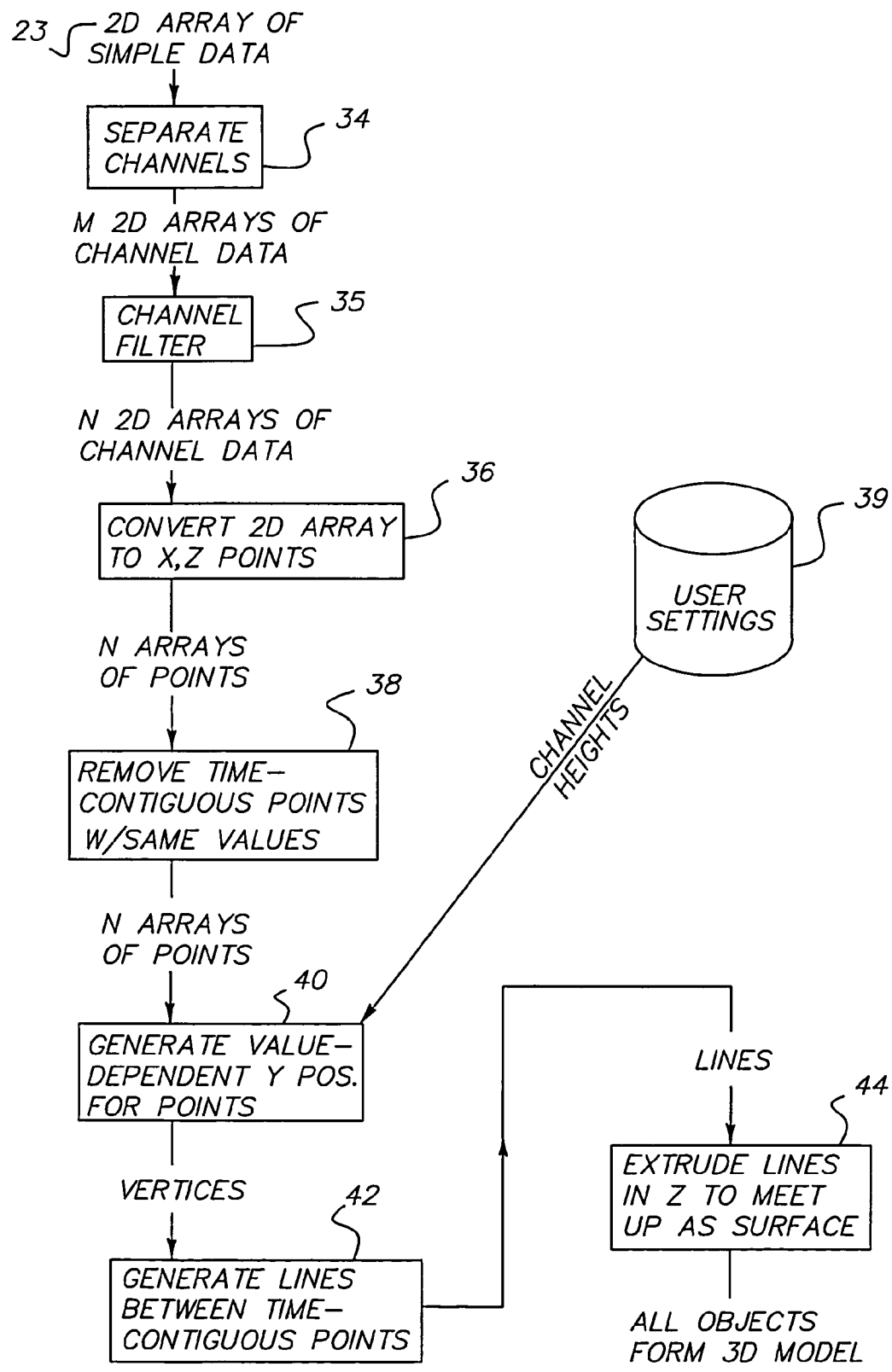
FIG. 7 is a flow chart of the processes in software on the computer system of FIG. 2 for the three-dimensional model generator of FIG. 4.
Figure 8A:
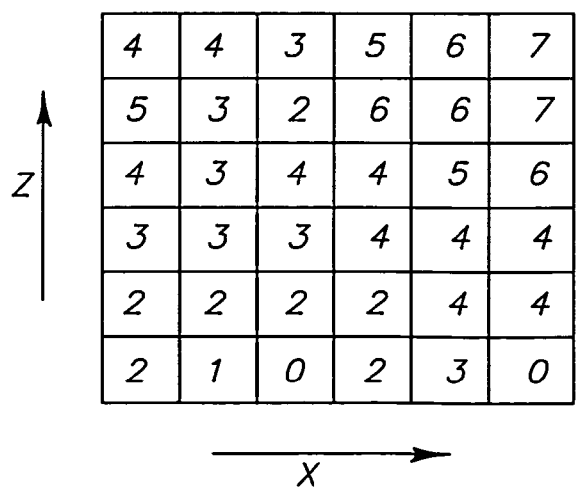
Figure 8B:
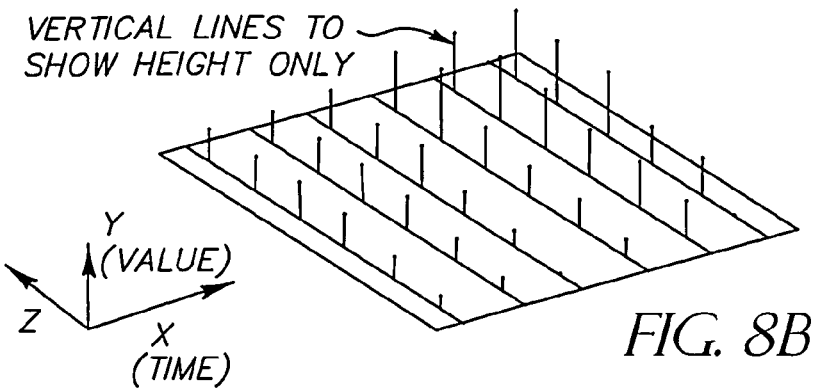
Figure 8C:
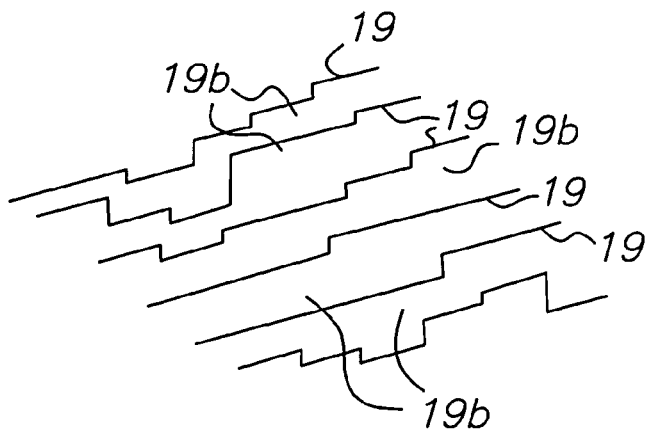
Figure 8D:
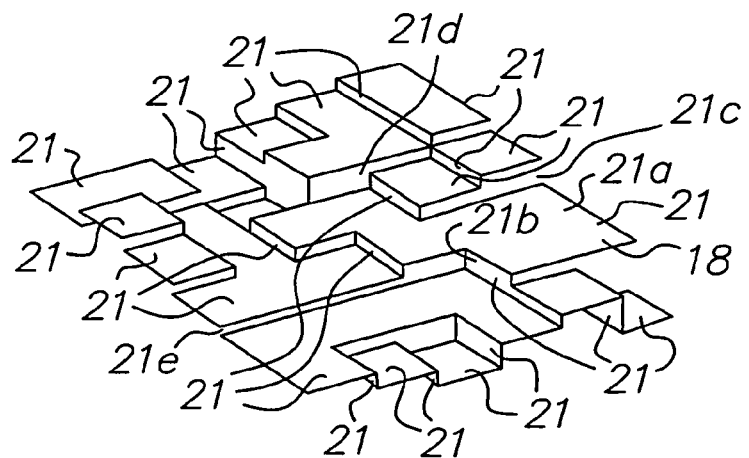
Figures 9A, 9B, 9C, 9D:
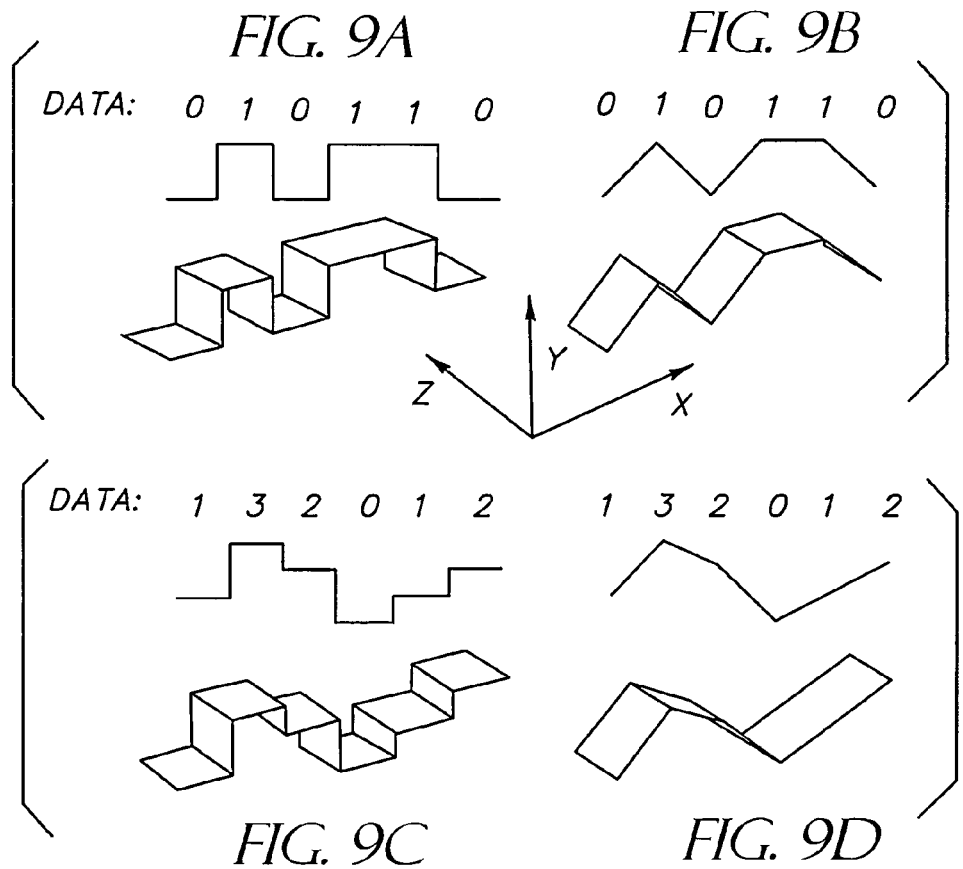
Figure 10:
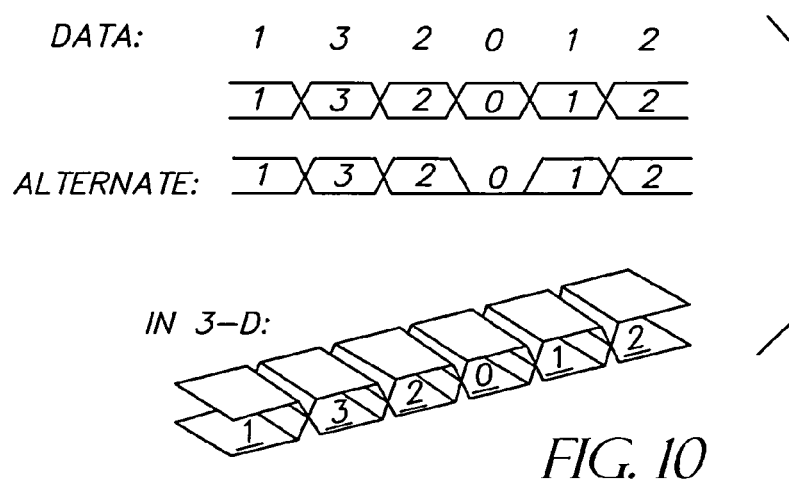
Figure 11:
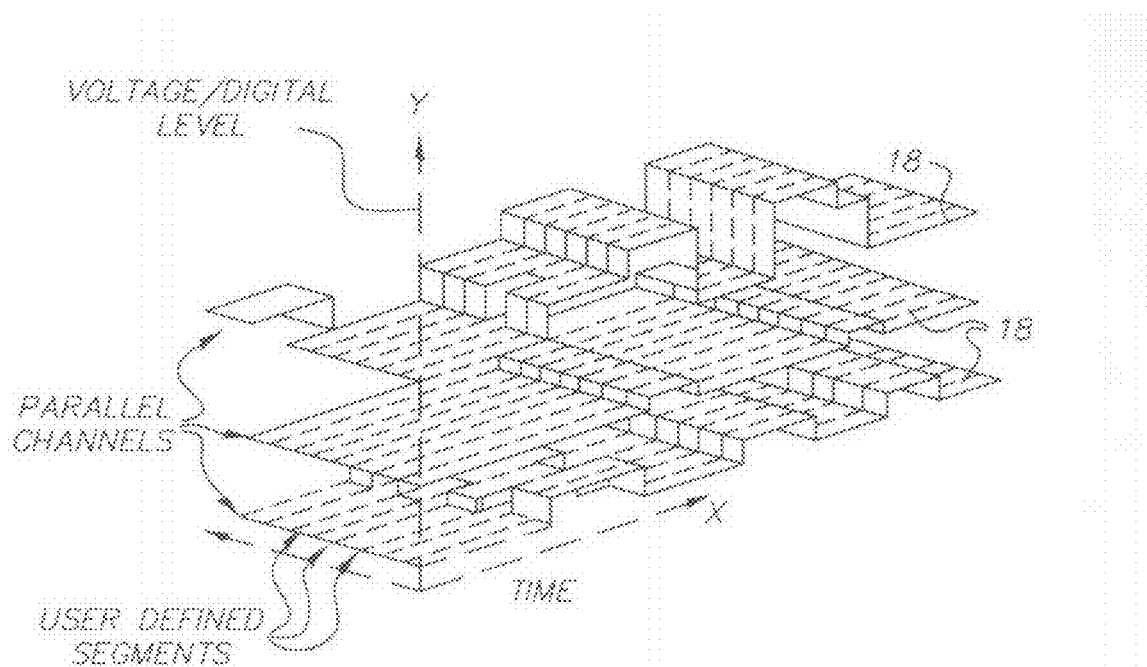
Figure 12:
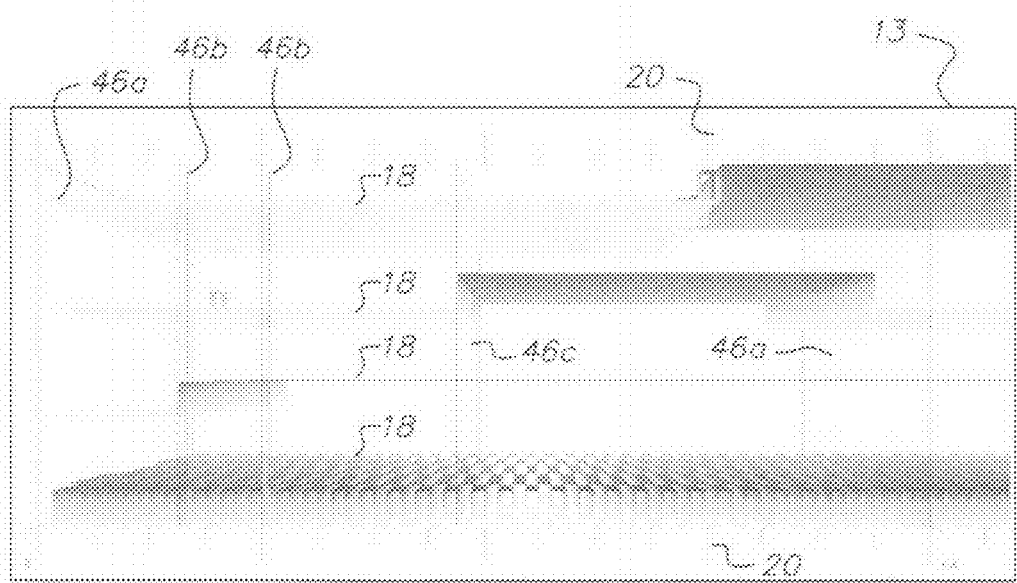
Figure 12A:
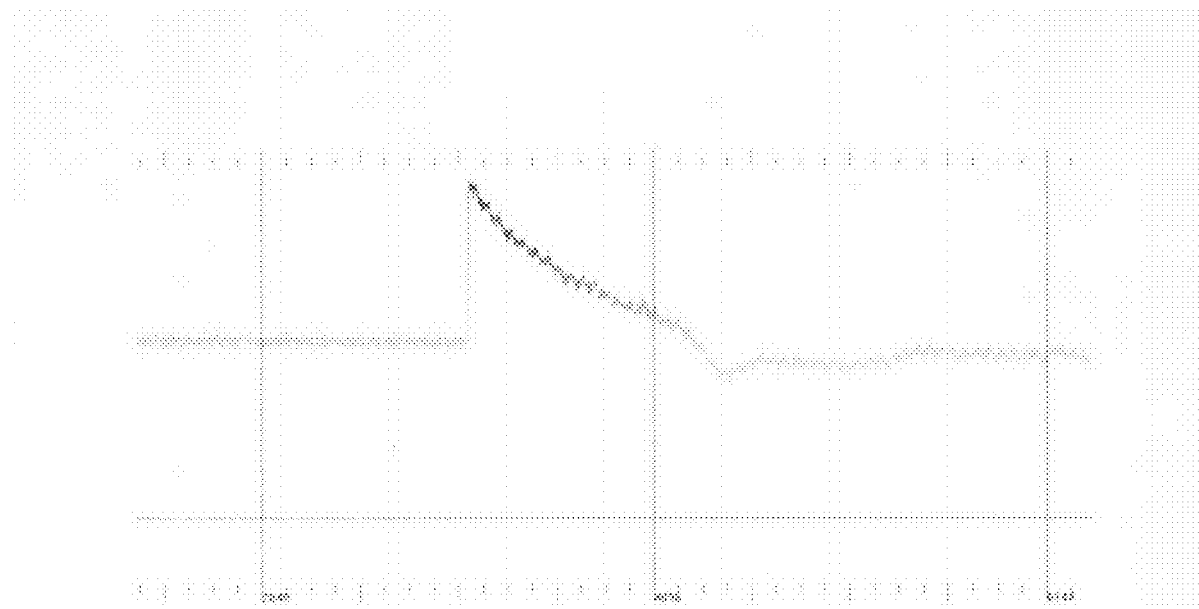
Figure 12B:
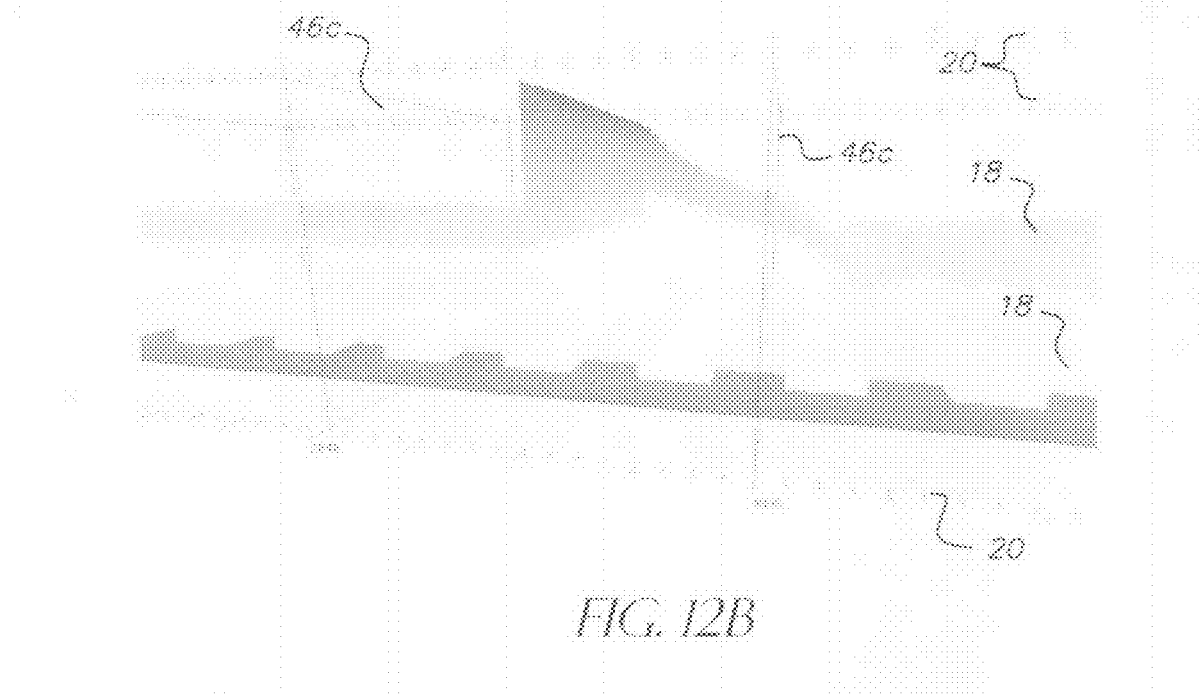
Figure 13:
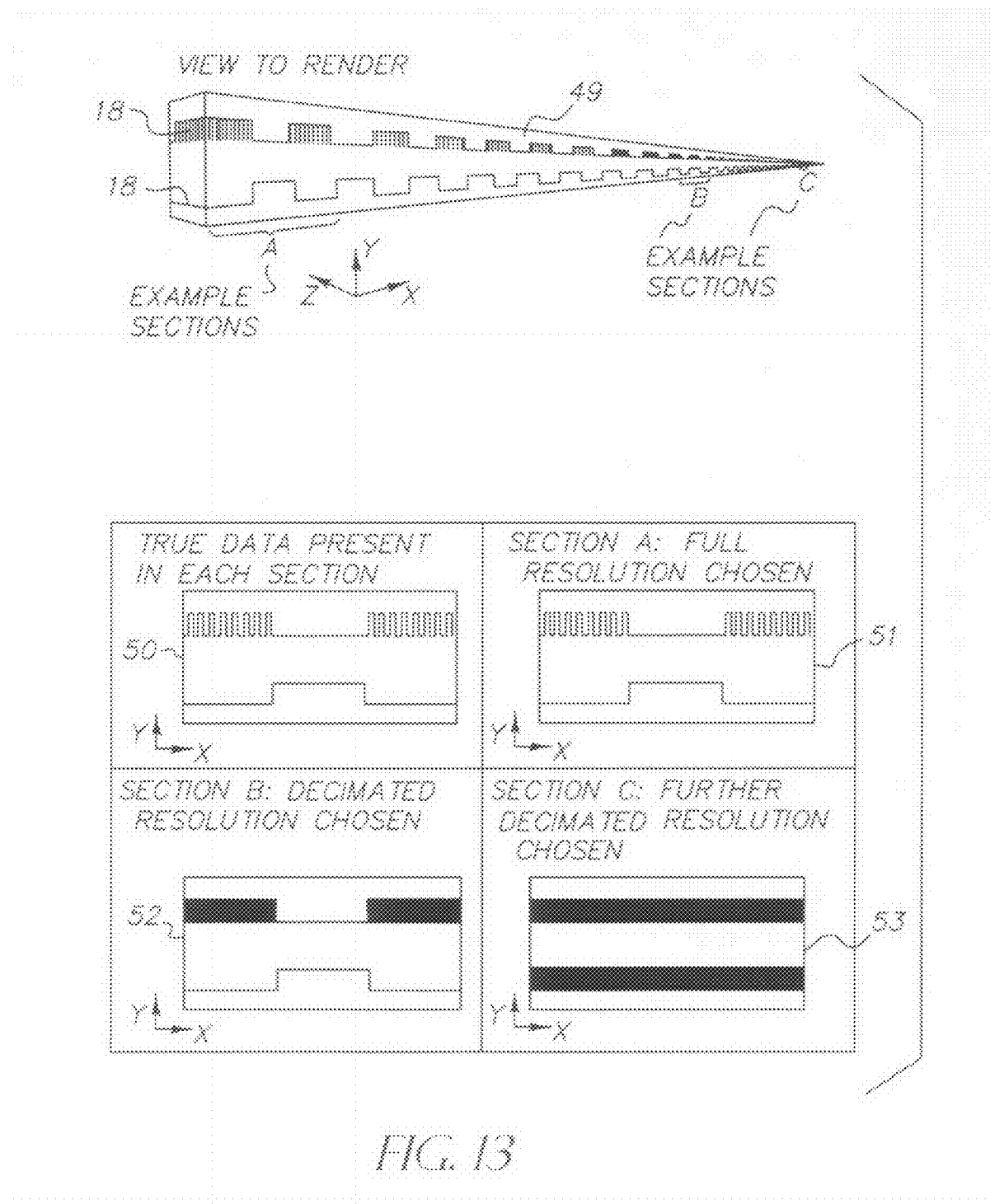
Figure 21:
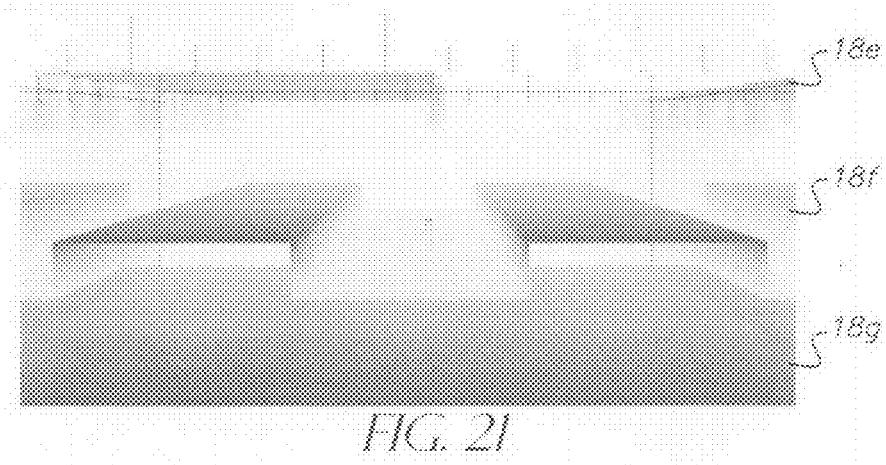
Figure 22:
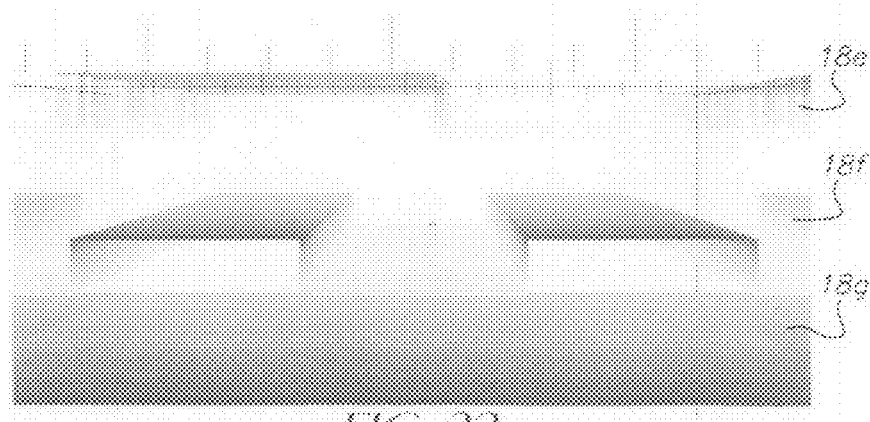
Figure 23:
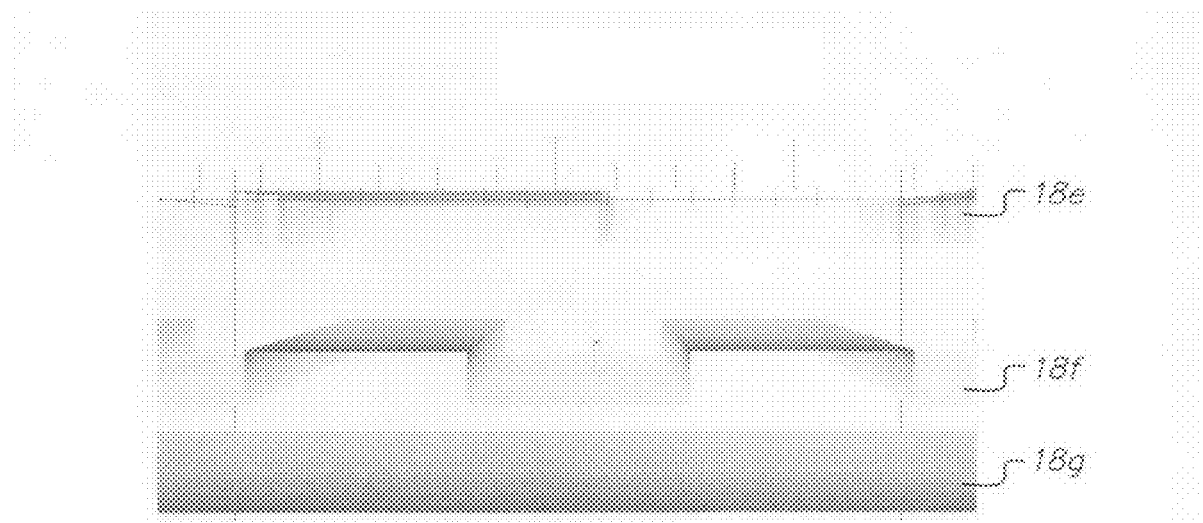
Figure 24:
Figure 25:
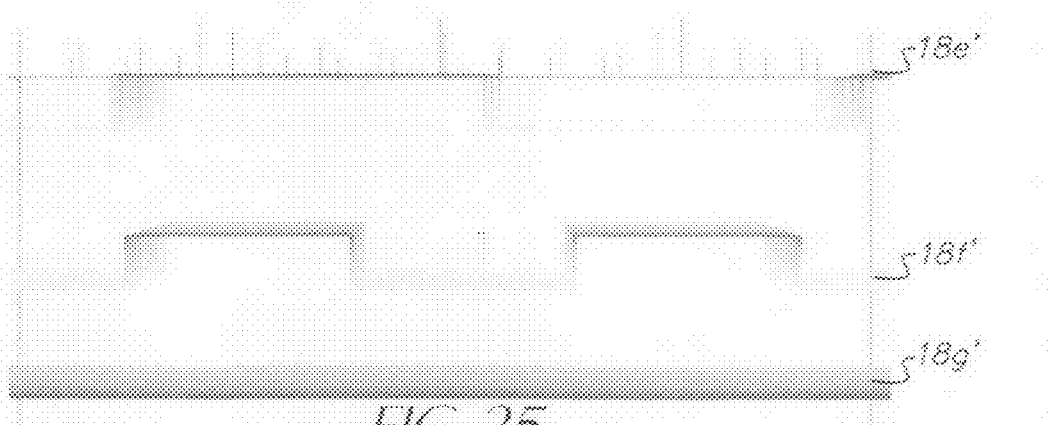
Figure 26:
Figure 26:
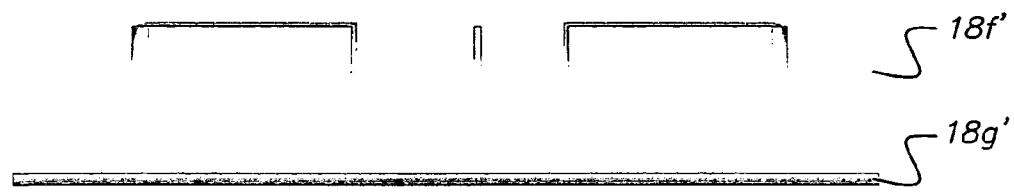
Figure 27:
Figure 27:
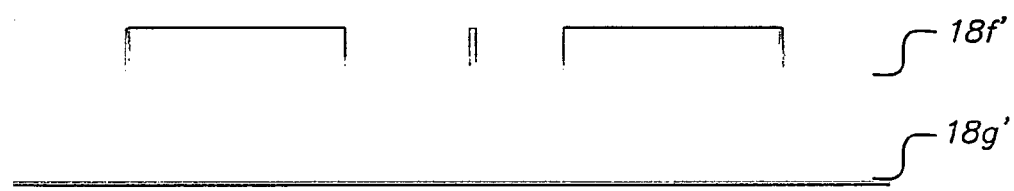
Figure 28:
Figure 28:
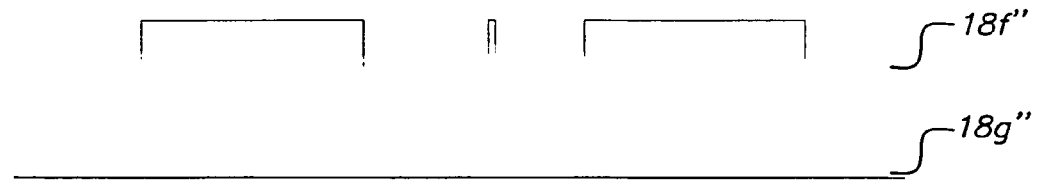
Figure 29A:
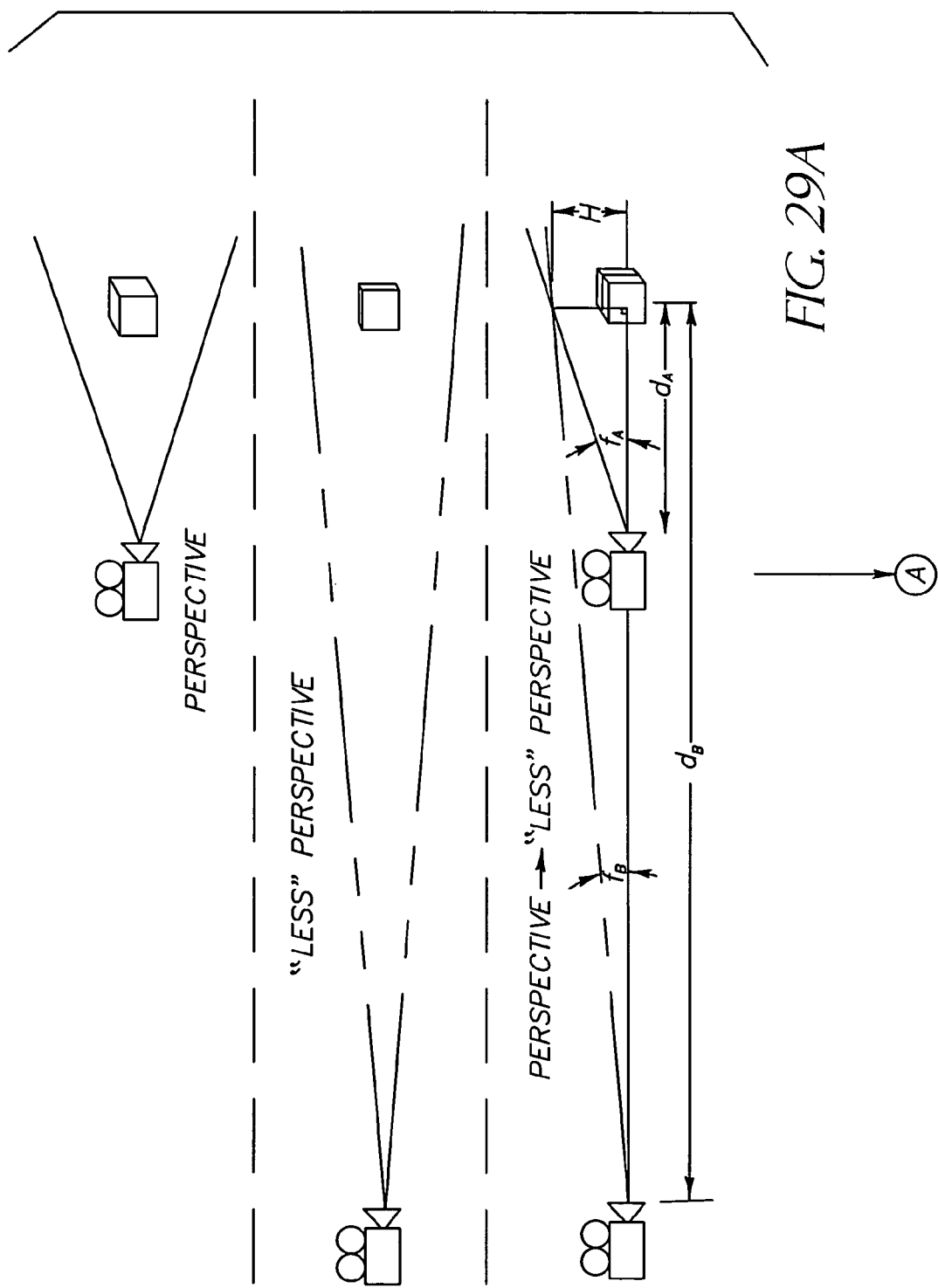
Figure 29B:
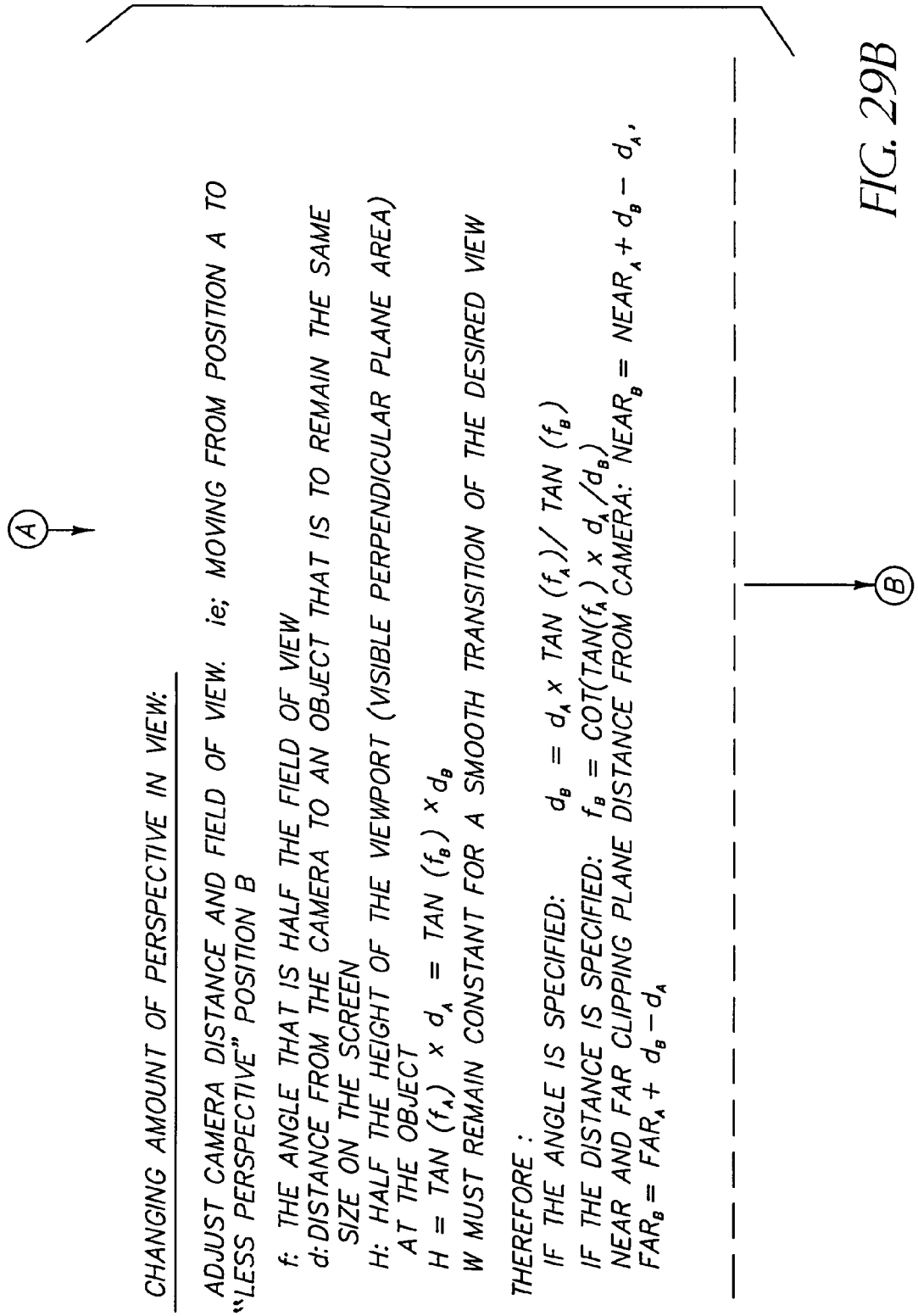
Figure 29C:
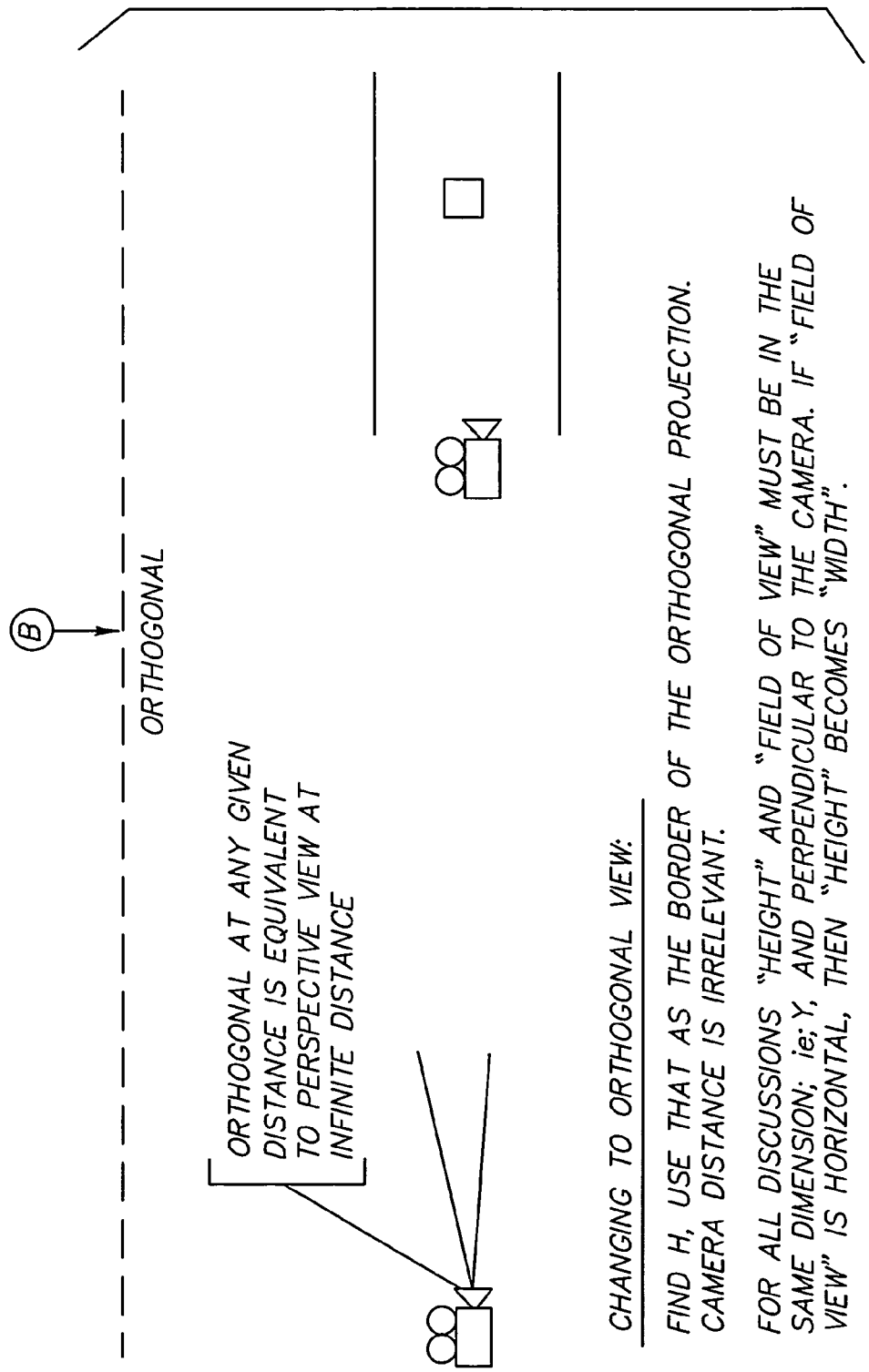
Figure 30A:
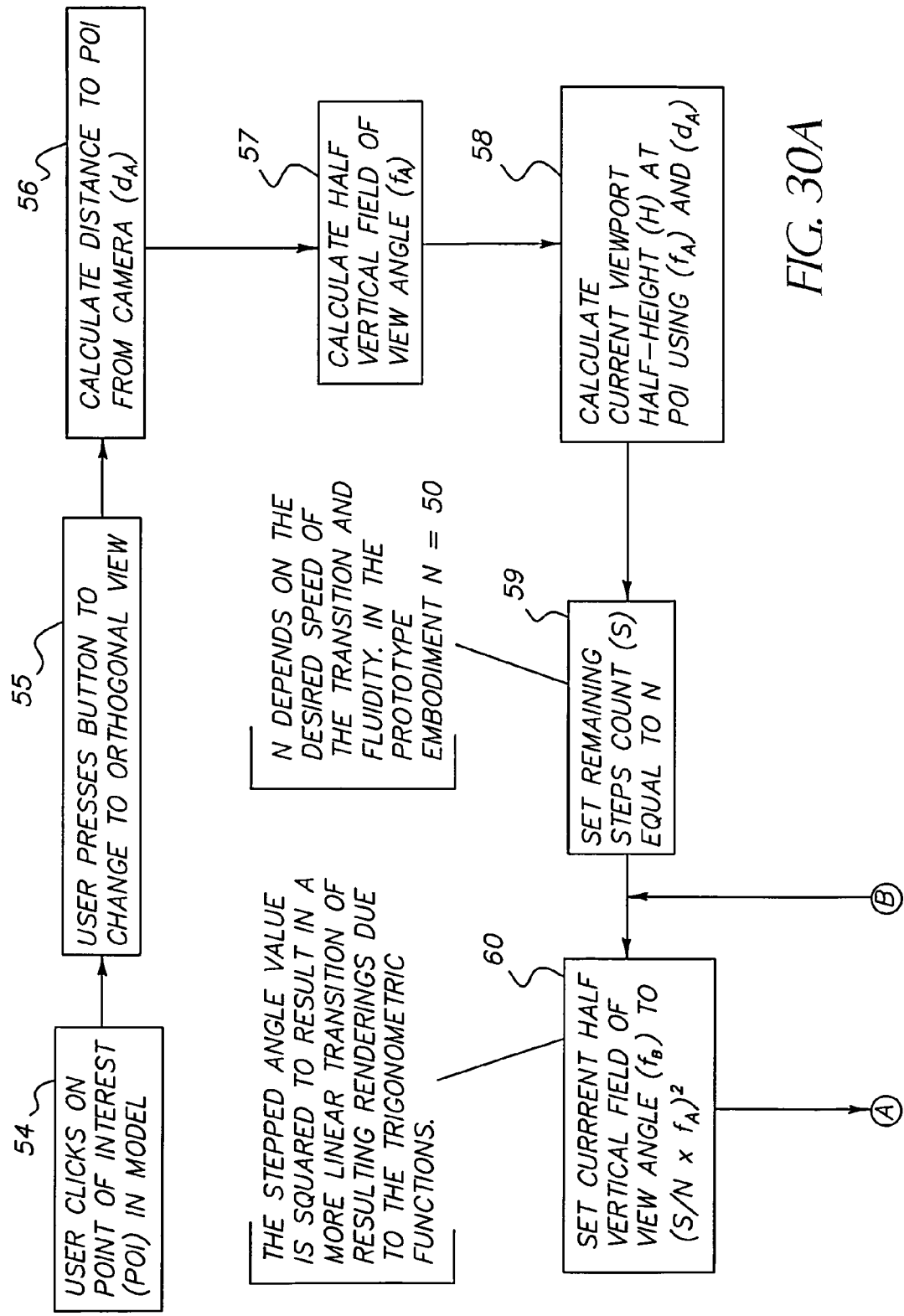
Figure 30B:
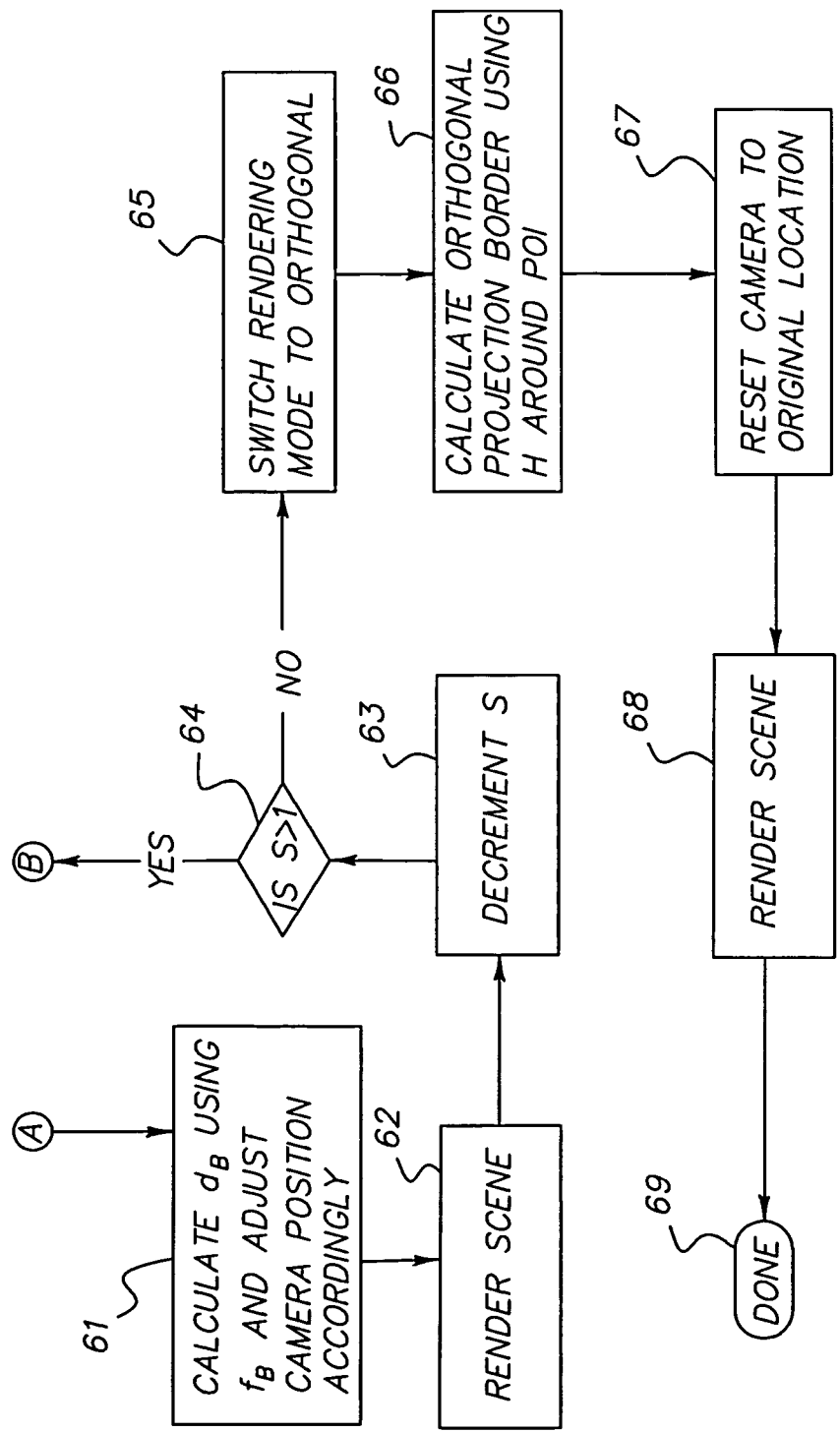
Figure 31:
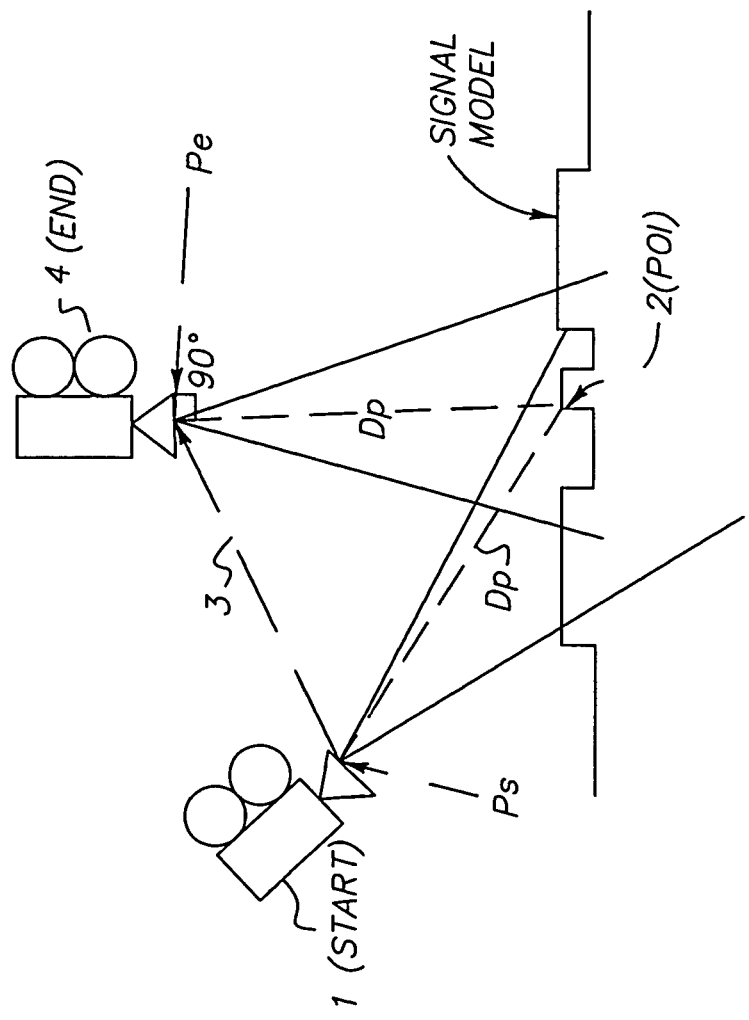
Figure 32:
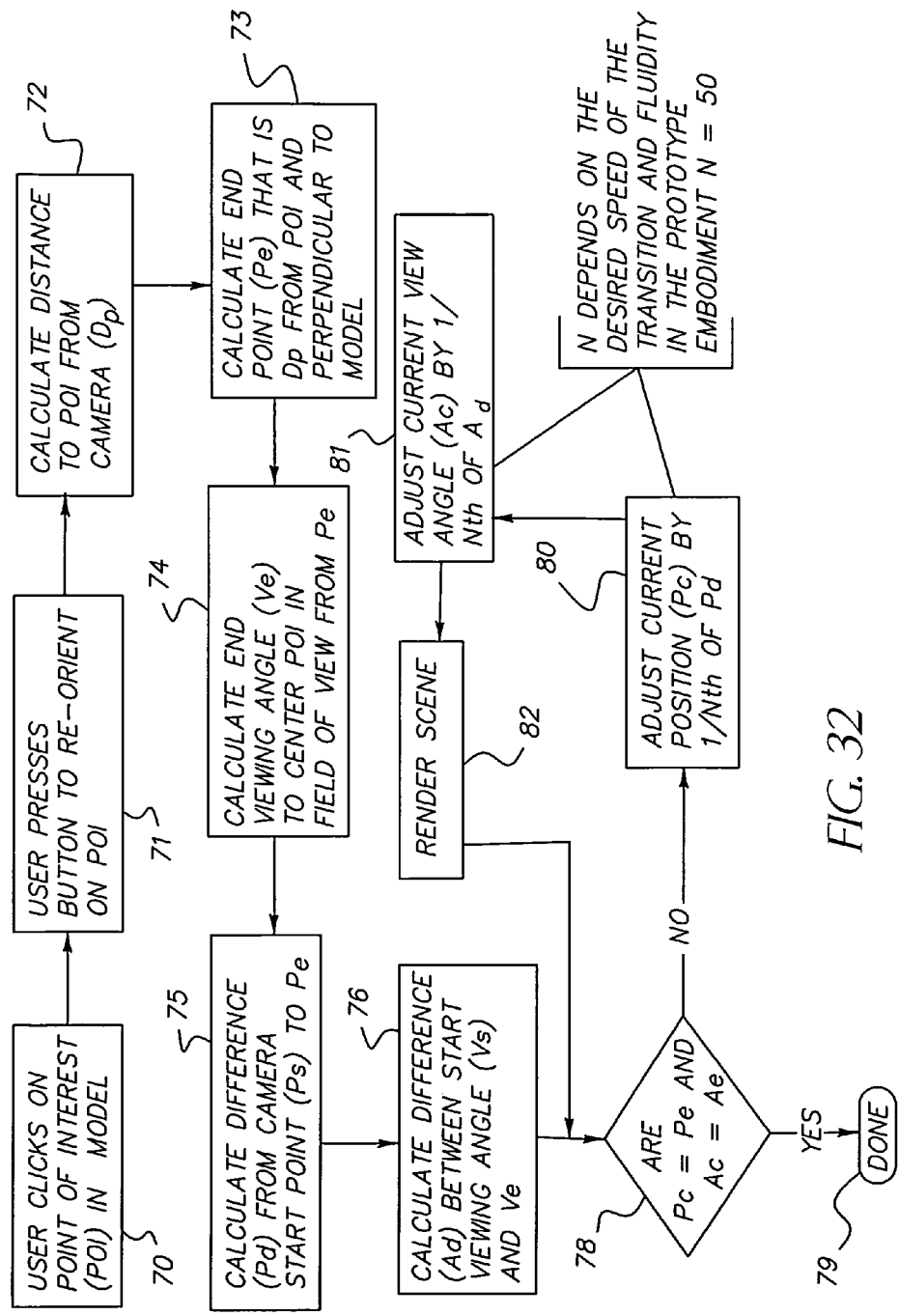
Figure 33:
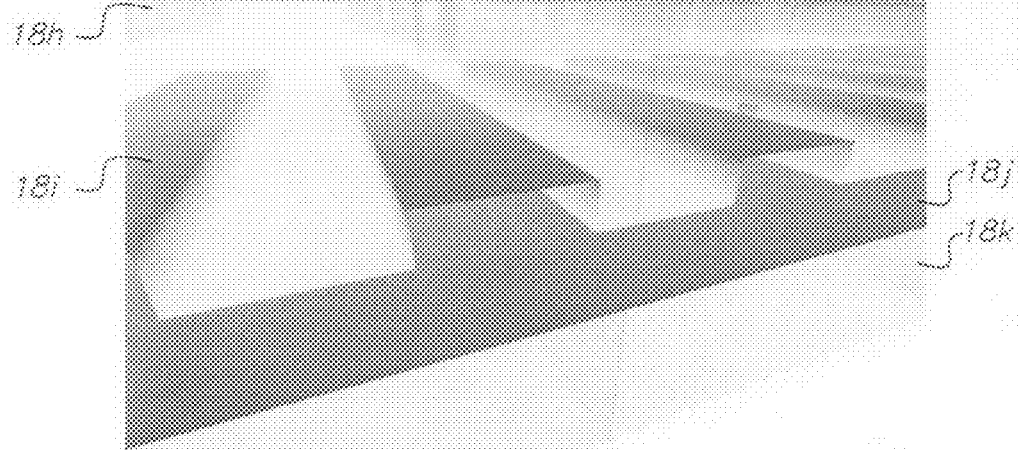
Figure 34:
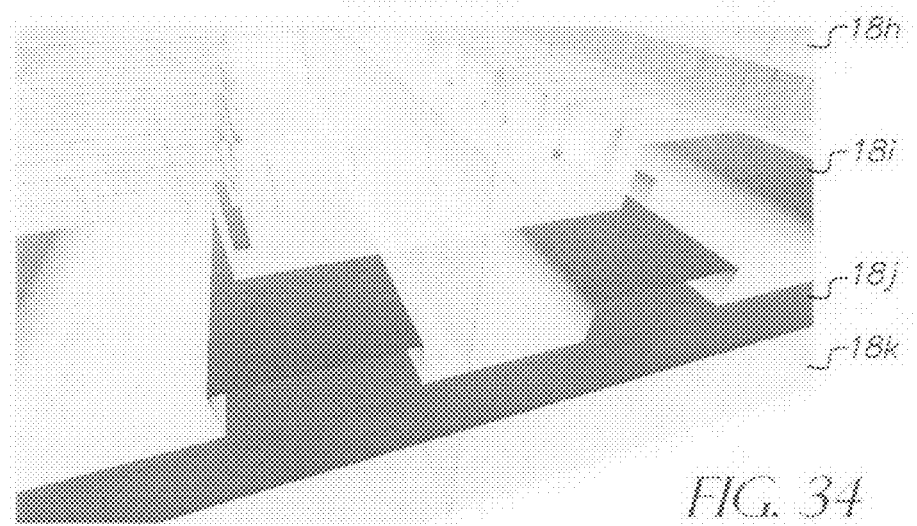
Figure 35:
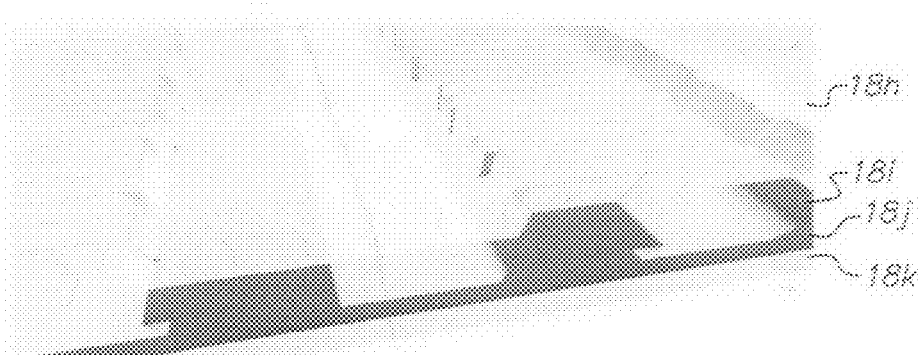
Figure 36:
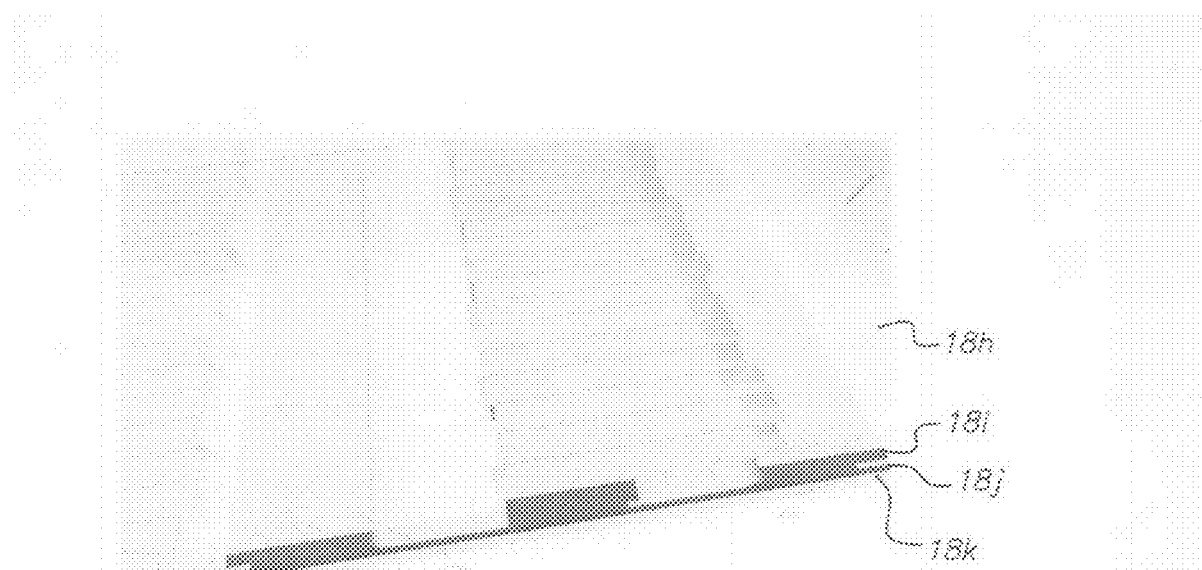
Figure 37:
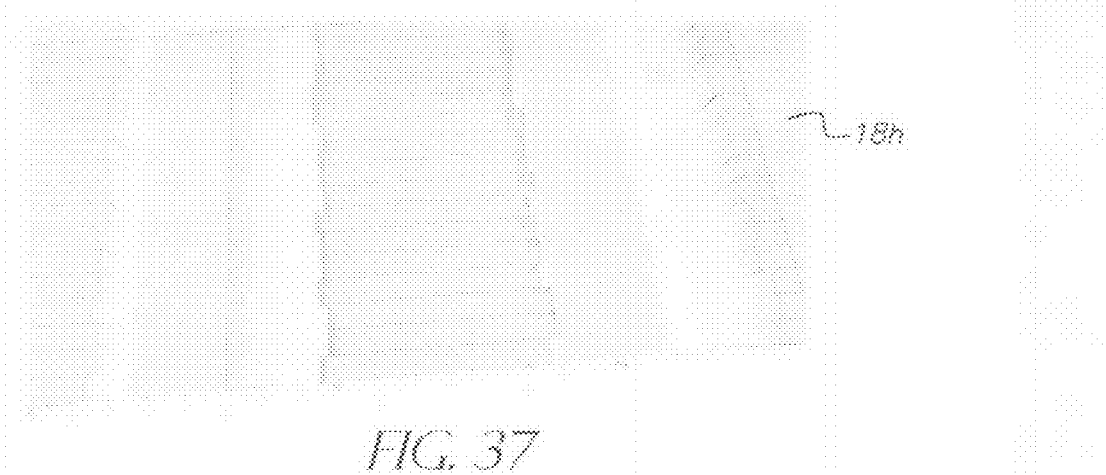
Figure 38:
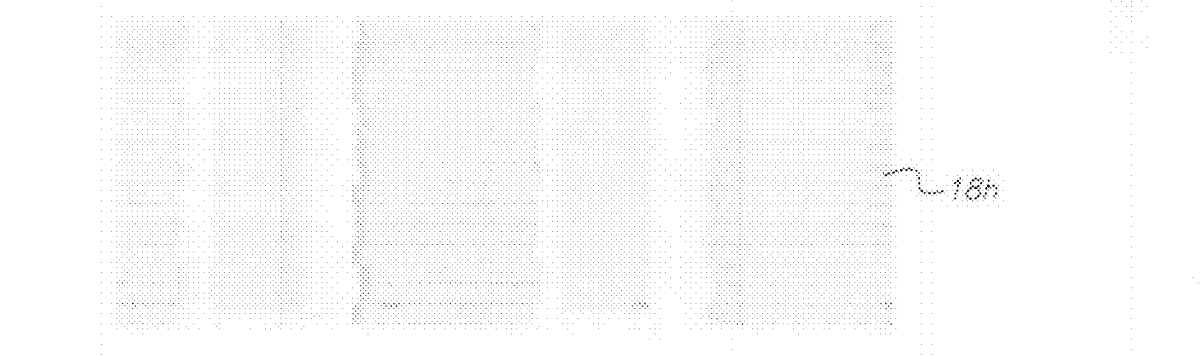
Figure 39:
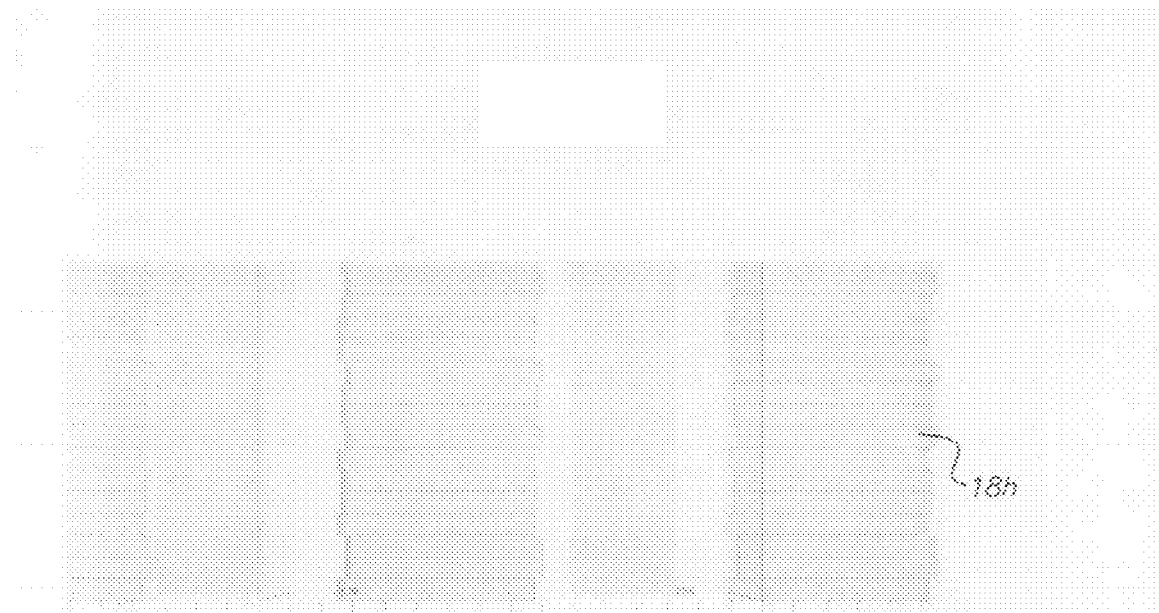
Figure 40:
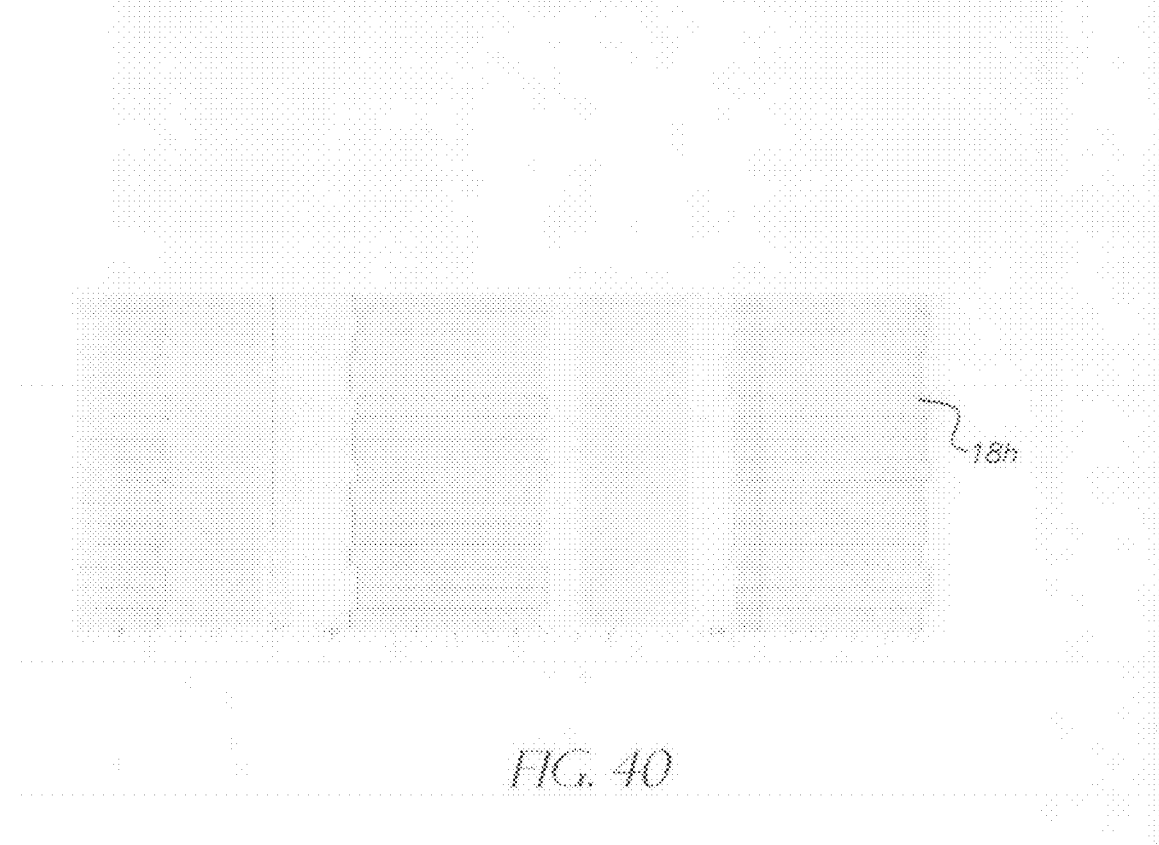
Figure 41:
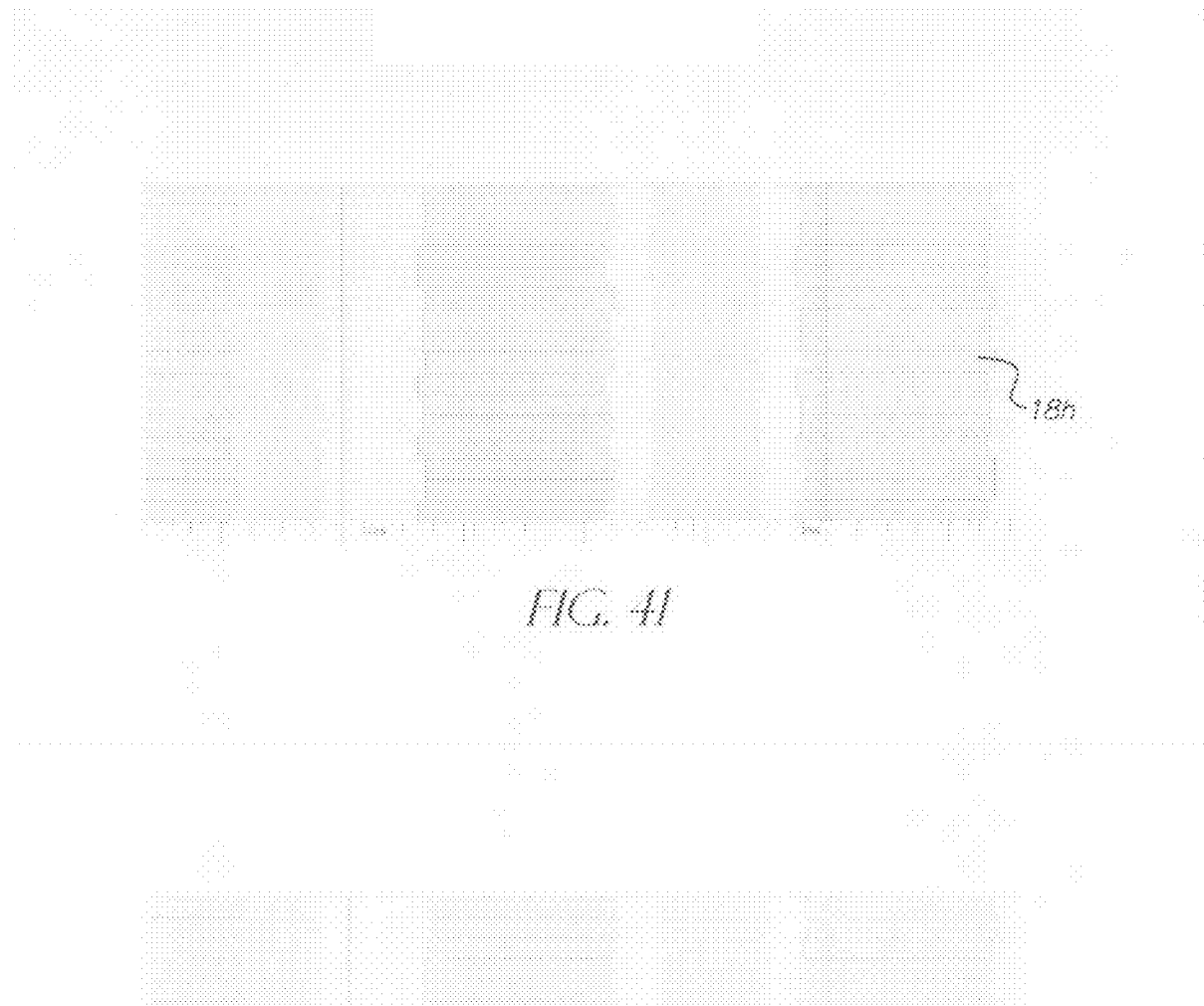
Figure 42:
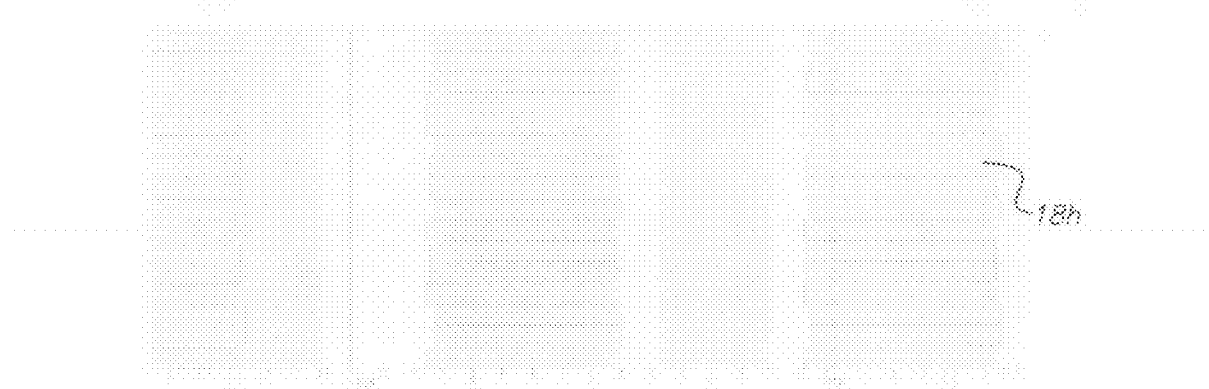
Figure 43:
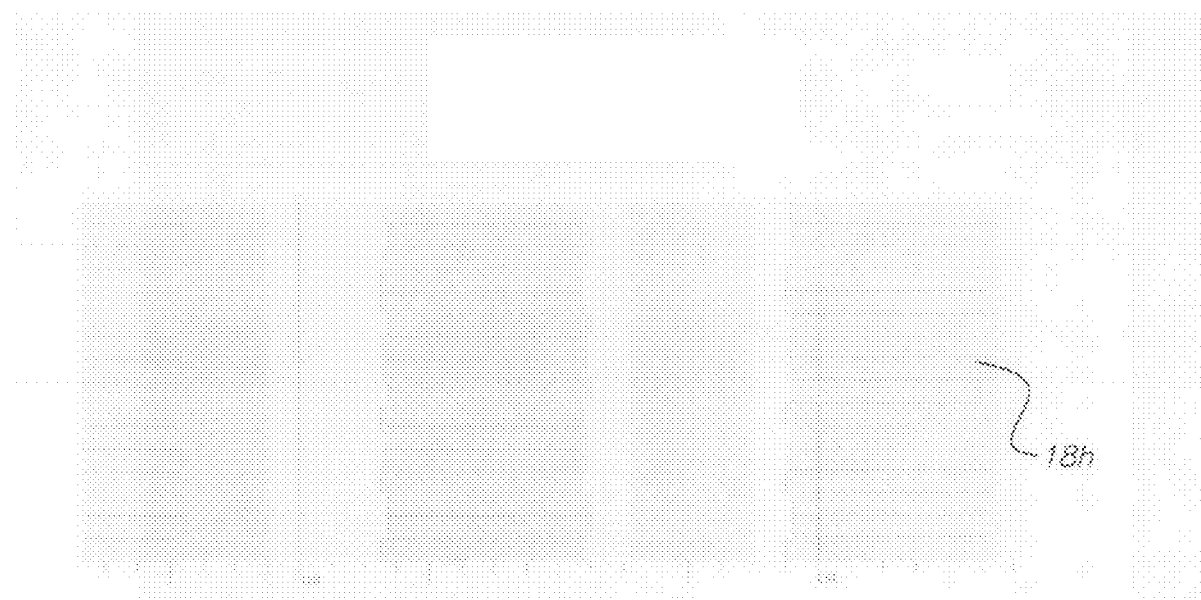
Figure 44:
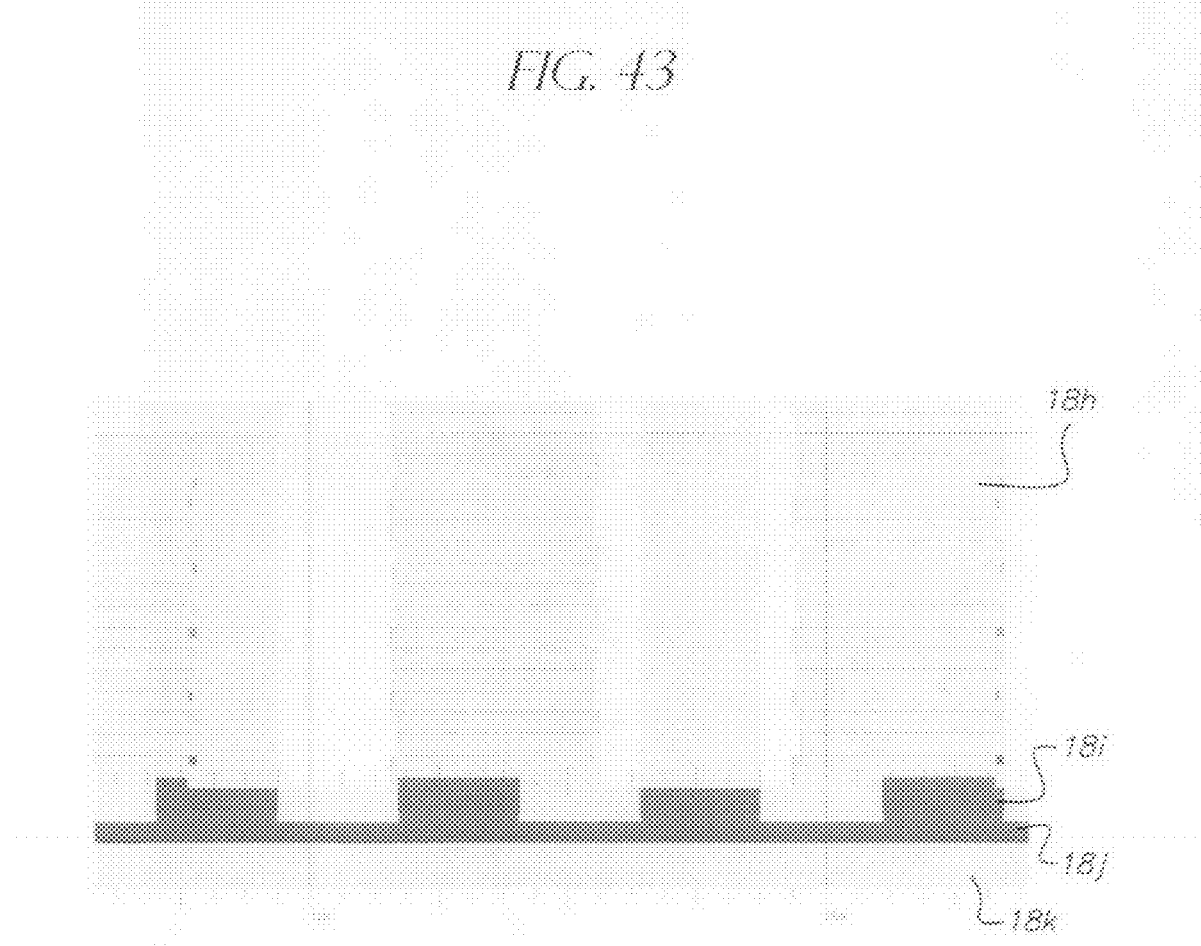
Figure 45:
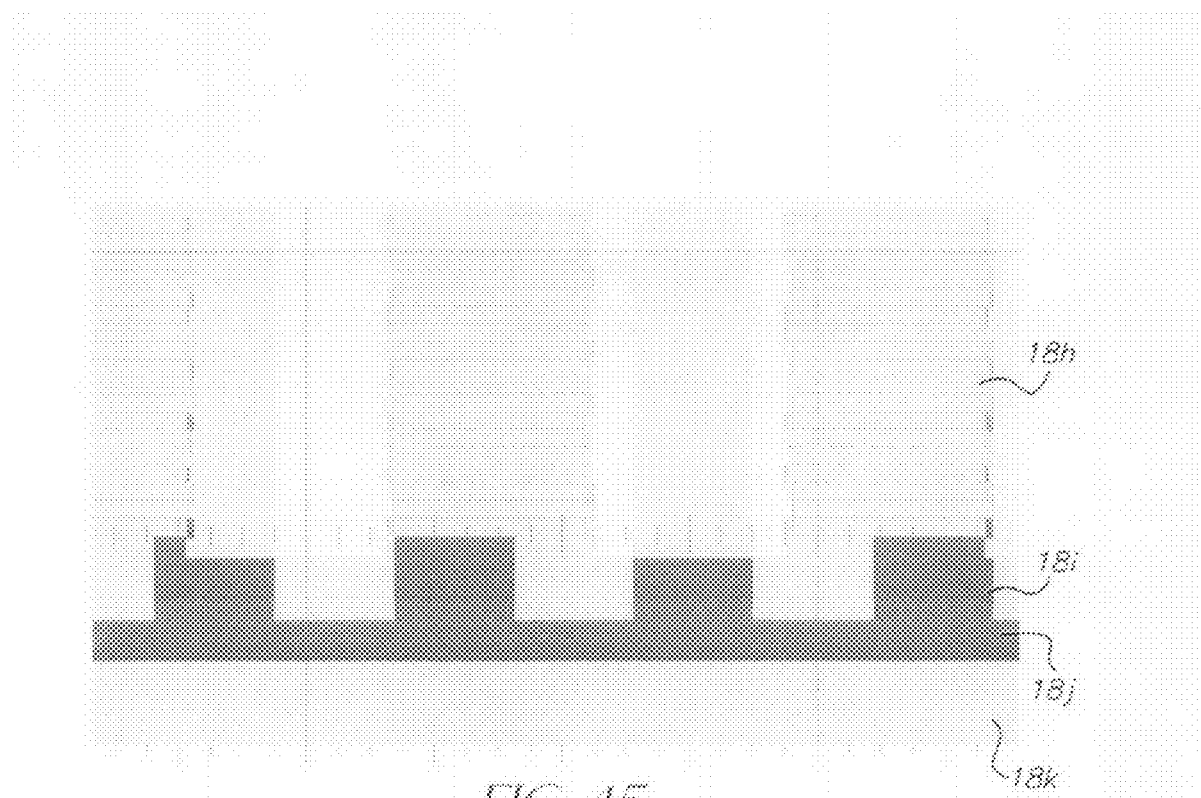
Figure 46:
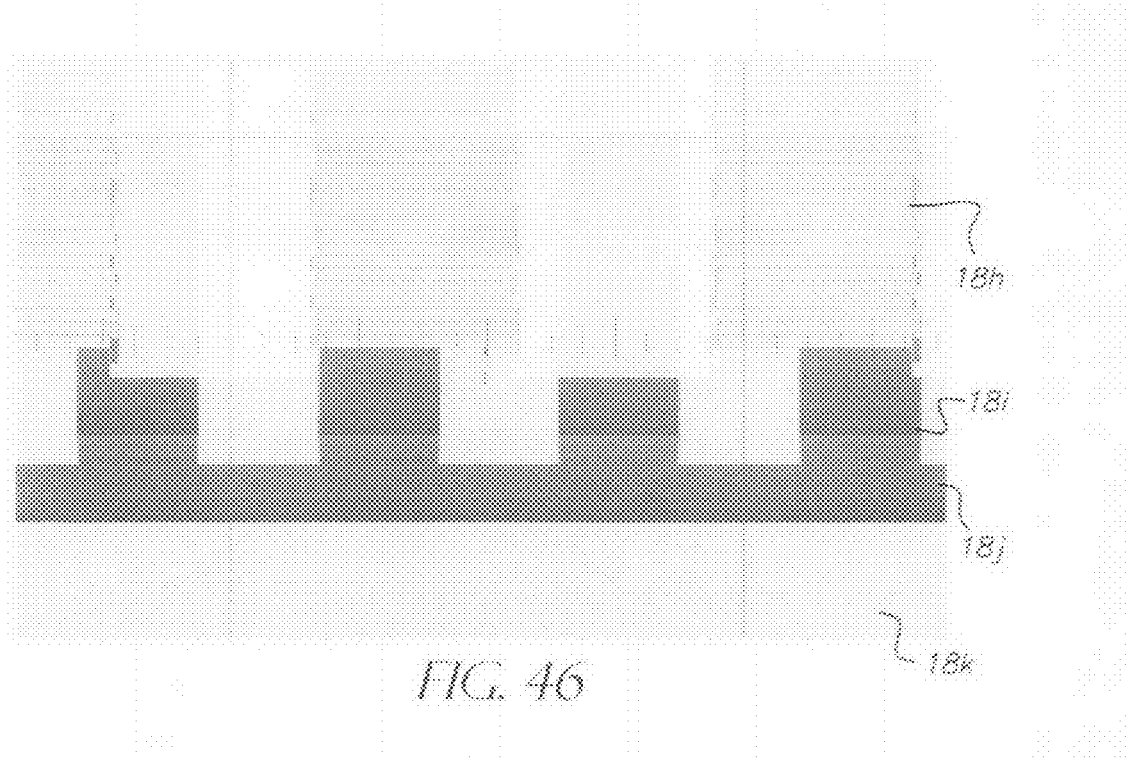
Figure 47:
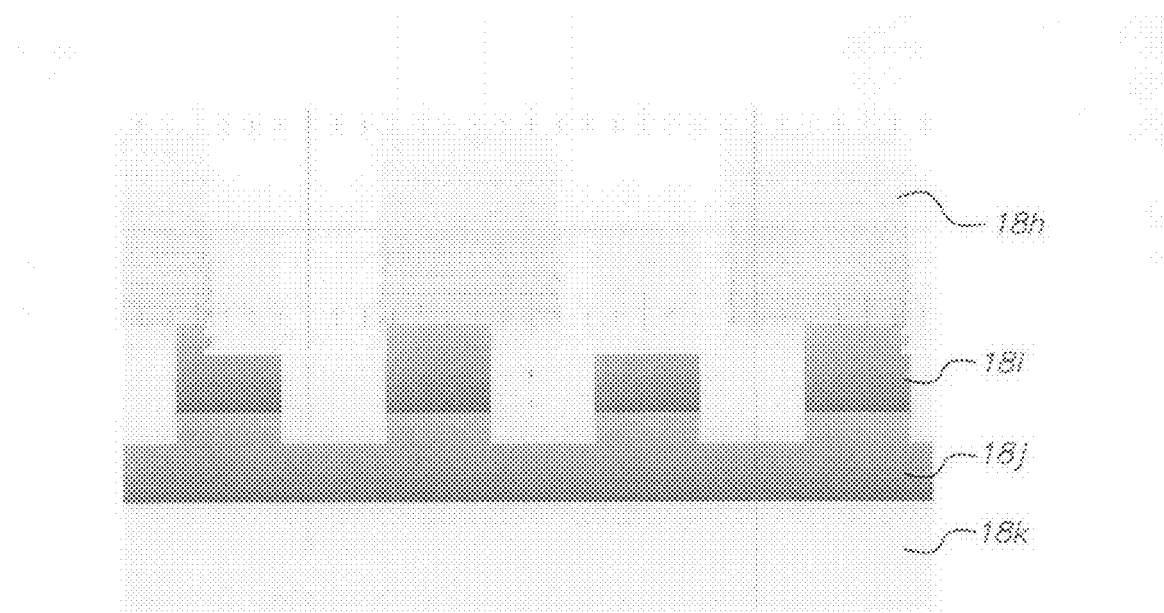
Figure 48:
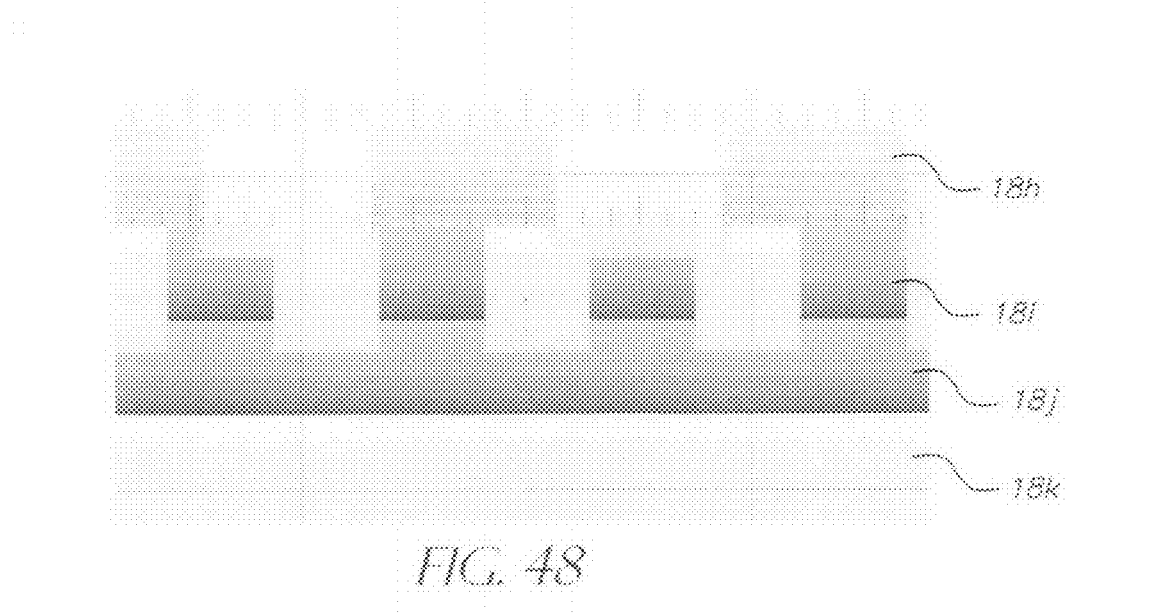
Figure 49:
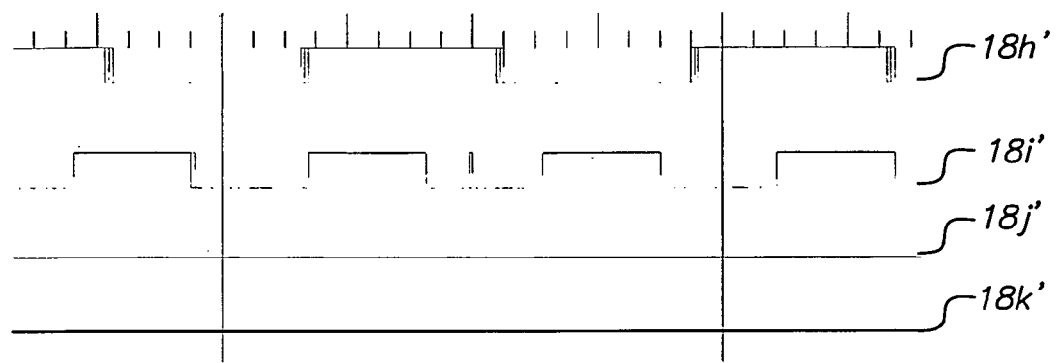
Figure 50:
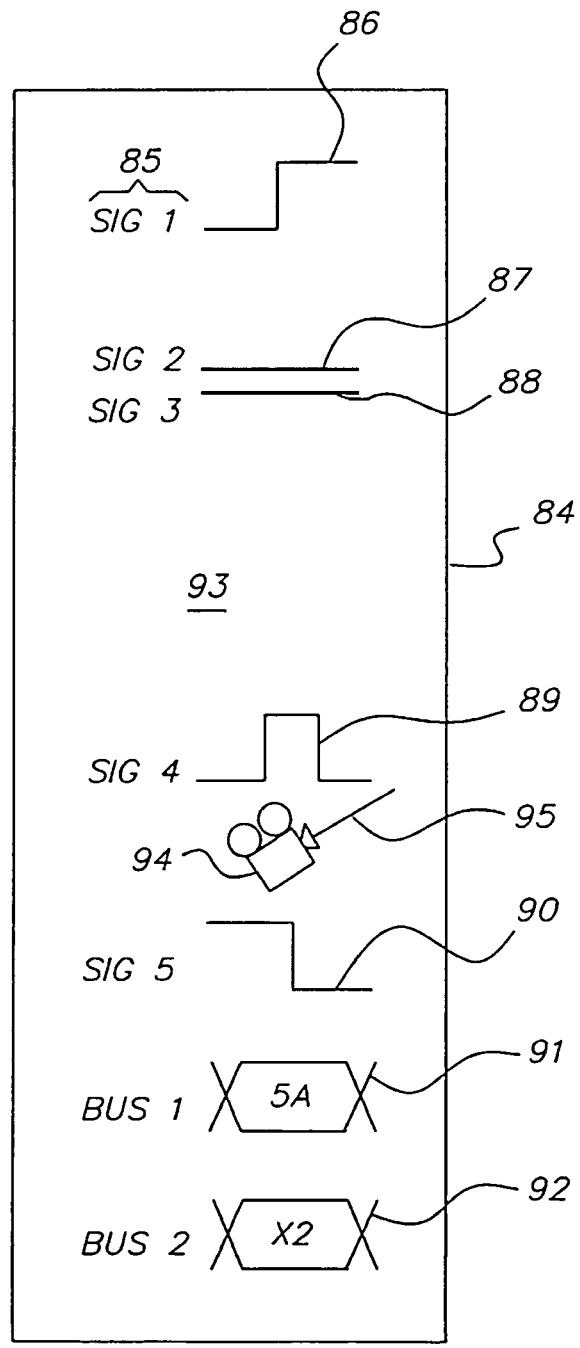
Figure 51A:
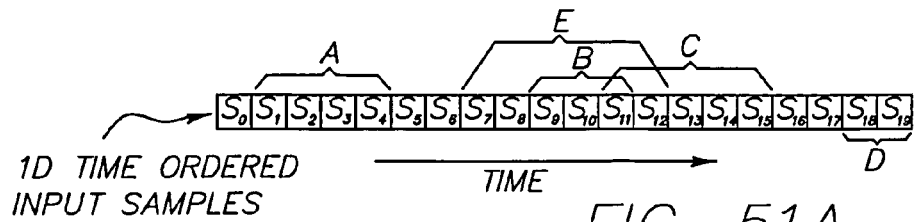
Figure 51B:
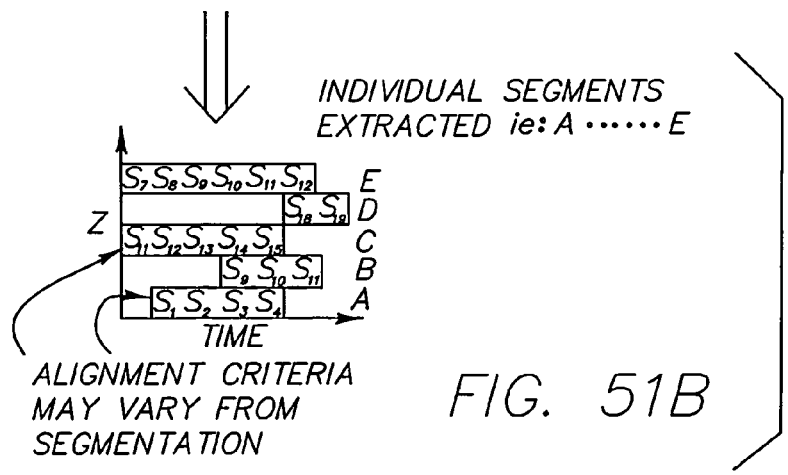
Figure 52:
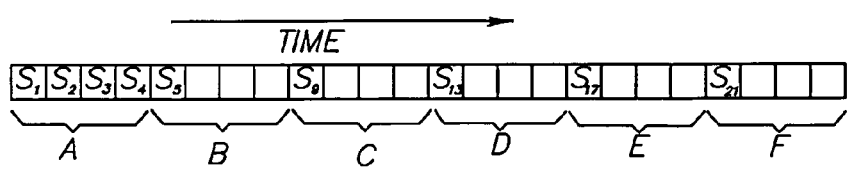
Figure 52:
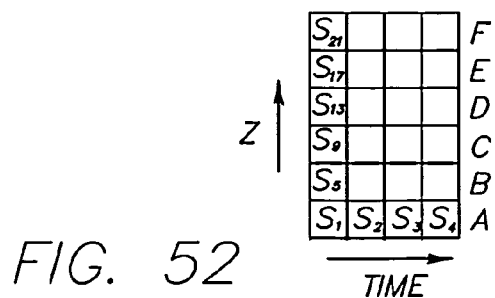
Figure 53:
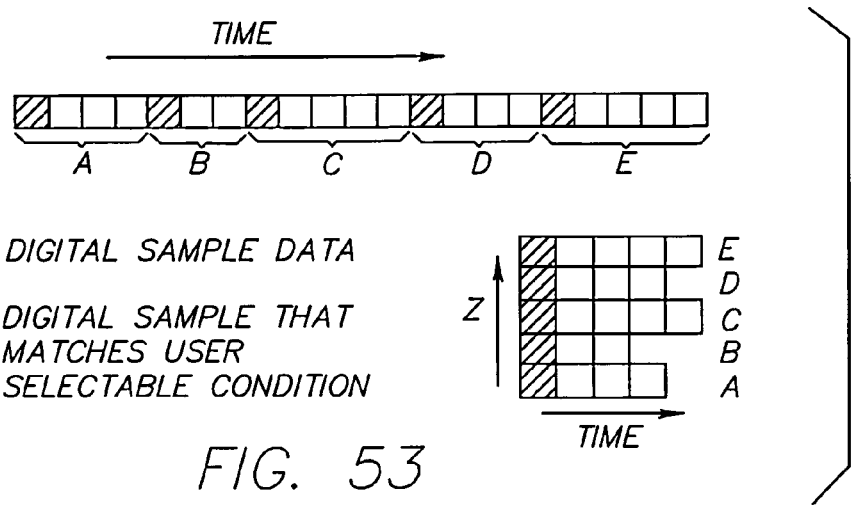
Figure 54:
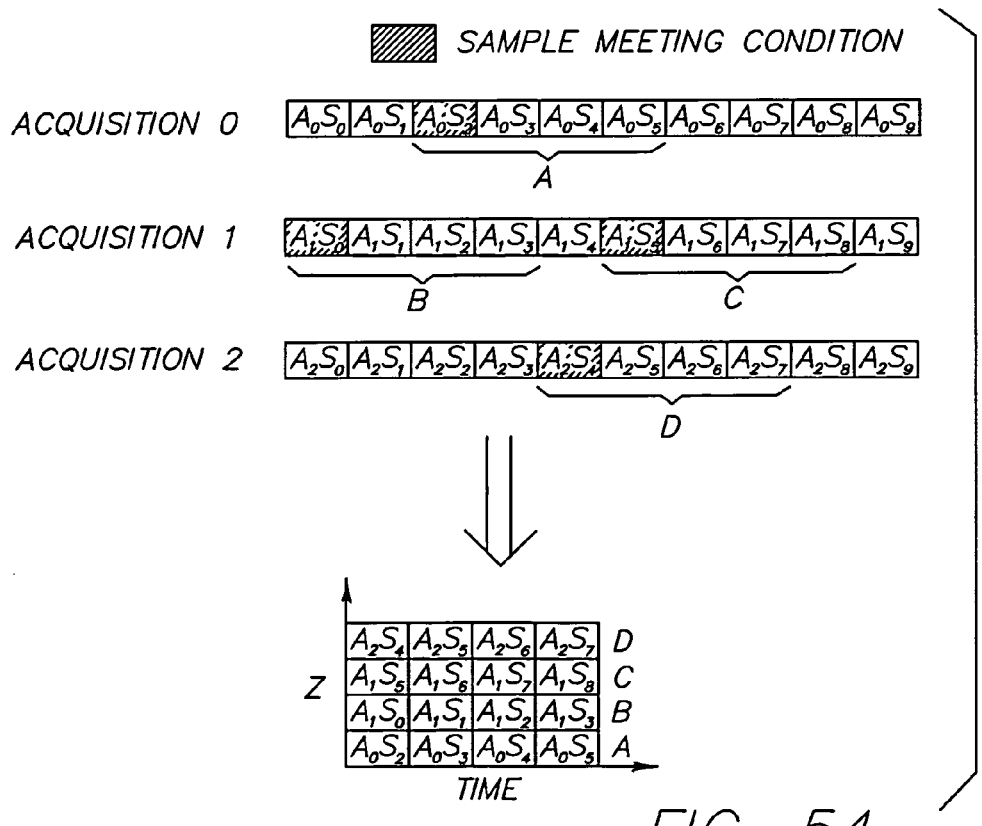
Figure 55:
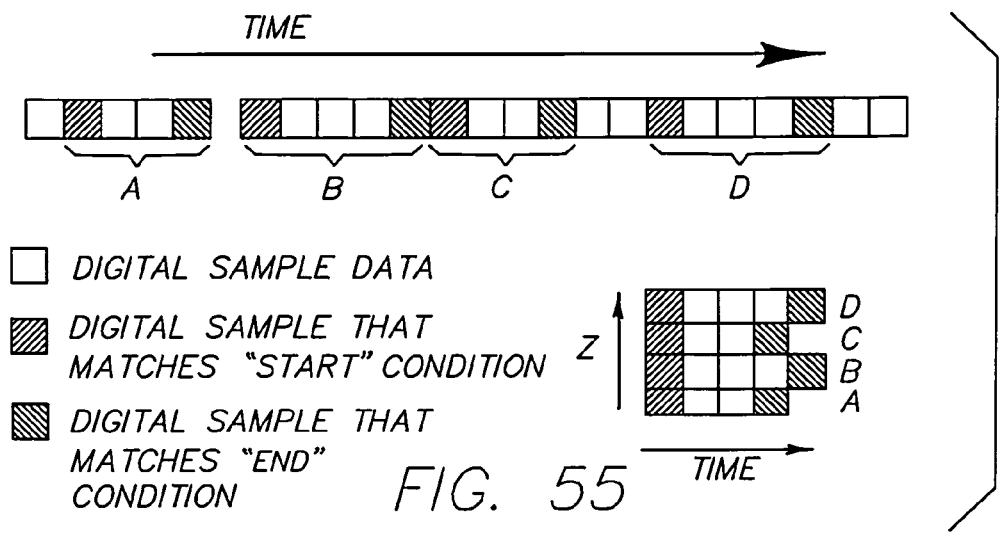
Figure 56:
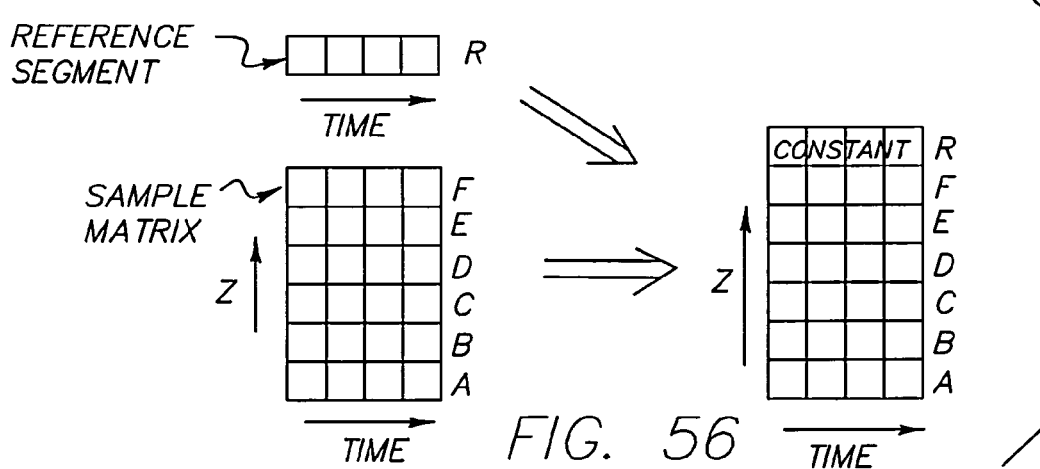
Figure 57:
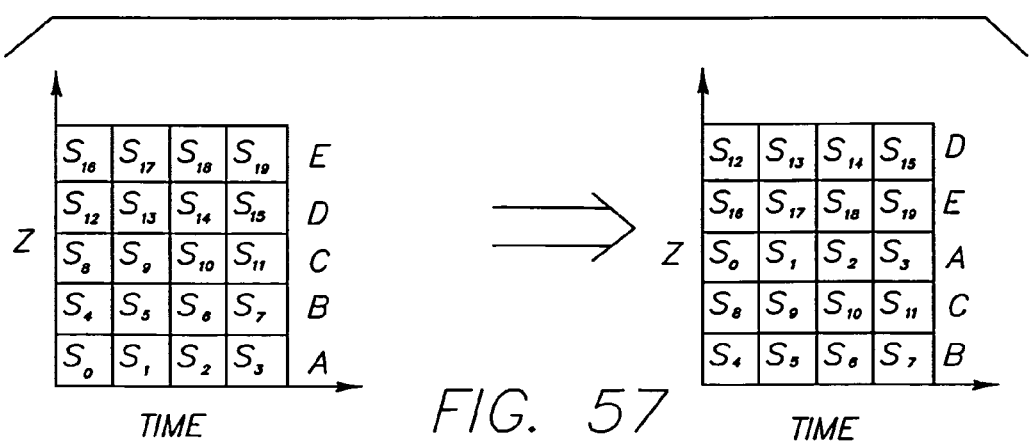
Figure 58:
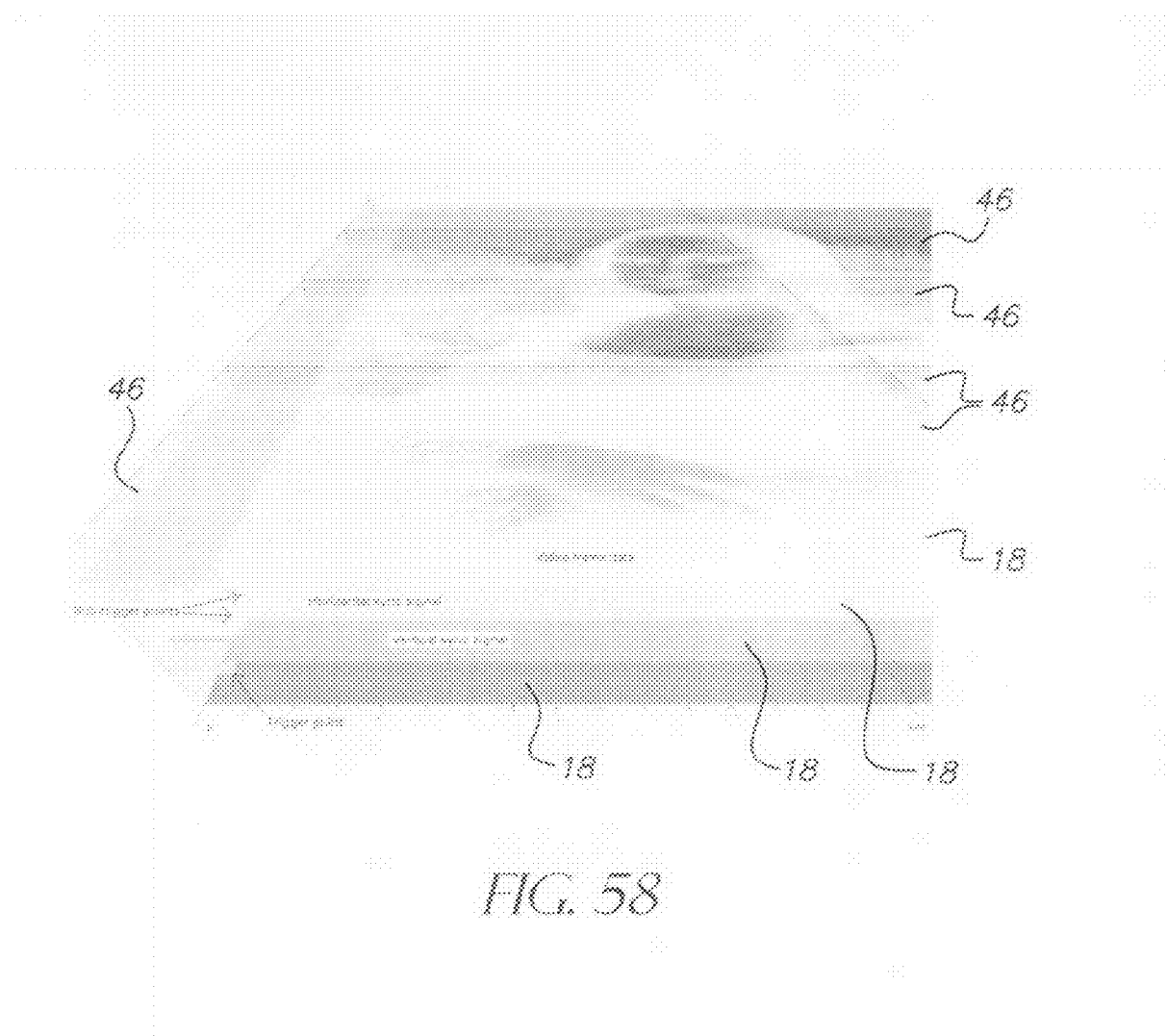

FIGS. 8A, 8B, 8C, and 8D graphically illustrate the processing of a single channel by the three-dimensional model generator of FIG. 4 as described in FIG. 7 from a two-dimensional array of segments of a signal channel into a three-dimensional surface, in which FIG. 8A represents the ordered segmented signal data in a two-dimensional array (x,z) in which each entry in the array has a value (y); FIG. 8B shows a graphical representation of the array as point locations in three-dimensional perspective; FIG. 8C shows a graphical representation of lines connecting time-adjacent points of each segment of FIG. 8B; and FIG. 8D shows a graphical representation of planes formed from such segments to form a three-dimensional channel surface, where the points are the vertices of the planes;

FIGS. 9A and 9B show different examples of single-bit digital signal data rendered in a two-dimension (x,y), and repeated segments of same data rendered in three dimensions (x, y, z) in which adjacent samples form planes having depth along the z axis;

FIGS. 9C, and 9D shows different examples of analog, or multi-bit digital signal data rendered in two-dimensions (x,y), and repeated segments of same data rendered in three dimensions (x, y, z) in which adjacent samples form planes having depth along the z axis;

FIG. 10 is another example of digital or analog signal data rendered in a two-dimension (x,y), and repeated segments of same data rendered in three dimensions (x, y, z) in which adjacent samples form planes having depth along the z axis;

FIG. 11 shows a schematic illustration of multiple three-dimensional channels as ordered surfaces rendered in a single view on a screen of the display of FIGS. 2 and 4 in which the surface characterizing each of the channels are aligned with each other with a common time base (x) to facilitate viewing of the relationship of channels with respect to each other;

FIG. 12 shows an example of four three-dimensional channel surfaces rendered in a view on a screen of the display of FIGS. 2 and 4 having non-signal objects of three-dimensional planes extending through the channel surfaces to illustrate events in signals occurring at the same time along multiple signal channels, and measurement and grid markers associated with time;

FIG. 12A is an example of the output rendered by the system of FIG. 2 in visualizing a two-dimensional view of four channels of electrical signals over time where three of the channels are digital and one of the channels is analog;

FIG. 12B is an example of the output rendered by the system of FIG. 2 in visualizing a three-dimensional view of same four channels of FIG. 12A;

FIG. 13 illustrates the use of lower resolution sections of a rendered view of multiple signals channels on a display of FIGS. 2 and 4 as the view extends in virtual distance from the viewer;

FIGS. 14-20 show different representations of a three-dimensional view of multiple channels in which the user changes the viewing position, angle, or scale;

FIGS. 21-28 show different representations of a three-dimensional view of multiple channels changing from a three-dimensional perspective view of FIG. 21 to a two-dimensional or orthogonal view of FIG. 28 with smooth transitions at intermediate representations of such view to visualize smooth transition at FIGS. 22-27;

FIGS. 29A, 29B, and 29C are a connected diagram showing the geometric method for smooth transitioning on the display from a three-dimensional rendering to a two-dimensional or orthogonal view, as shown for example in FIGS. 21-28 to enable smooth transitions of the display by the model visualizer of FIG. 4;

FIGS. 30A and 30B are a connected flow chart of the process in software on the computer system of FIG. 2 for smooth transitioning on the display from a three-dimensional rendering to a two-dimensional or orthogonal view, as shown for example in FIGS. 21-28;

FIG. 31 is a ray diagram to illustrate the geometry for reorienting of the rendered three-dimensional model of multiple channels to a view perpendicular to a user selected point of interest by the model visualizer of FIG. 4;

FIG. 32 is a flow chart of the processes in software on the computer system of FIG. 2 for automatic reorienting of the rendered three-dimensional model of multiple channels to a view perpendicular to a user selected point of interest by the model visualizer of FIG. 4;

FIG. 33-43 show different representations of a view of a three-dimensional view of multiple channels smoothly reorienting to a view perpendicular to a user selected point of interest, and then transitioning to a two-dimensional or orthogonal view to perform in-depth analysis of the data and timing around the event;

FIGS. 43-49 show different representations of an orthogonal view of a three-dimensional view of multiple channels as the viewpoint smoothly rotated around a point of interest from a top-down view to a traditional front-on view;

FIG. 50 shows an example of a control panel provided along the screen on the display of FIGS. 2 and 4 by the user interface module of FIG. 4 providing labels of the signal channels being rendered, the current activity of each signal channel, and current view and angle;

FIGS. 51A and 51B are similar to FIGS. 6A and 6B, respectively, in which the selection criteria of segments result in overlap and gaps of the samples within the segments in order to more generally show segmentation;

FIGS. 52-55 illustrate segmentation of signal data by the segmentation controller module of FIG. 4 to form a two-dimensional array of ordered segments based on different user defined parameters and the characteristics of the signals;

FIG. 56 illustrates the addition of a reference segment at the segmentation controller module of FIG. 4 that may be specified by the user and generated for inclusion in the set of segments;

FIG. 57 illustrates an example of the reordering of a two-dimension array of segment on conditions such as values in the data, original source, or acquisition order by the segmentation controller module of FIG. 4; and FIG. 58 is the display of FIGS. 2 and 4 of a three-dimensional view of a sampled live or recorded video image streaming from a unit under test along with other signals relevant to analysis in the system of the present invention.

DETAILED DESCRIPTION OF THE INVENTION

Referring to FIG. 2, the system 10 of the present invention has a computer system 12 with software in accordance with the present invention for rendering on a display 13 coupled to the computer system. The computer system 12 is connected to an acquisition device 15, such as a LeCroy Model No. MS-250 or MS-500 Mixed Signal Oscilloscope, or other logic analyzer or digital oscilloscope, receiving electrical signals from a device (or unit) 16 under test via test leads 17. For purposes of example, three leads 17 are shown for providing three electrical signals, but other number of leads may be used depending on the acquisition device 15. The acquisition device outputs digital data to the computer system 12 representing multiple channels of electrical signals received from leads 17, where each channel represents a signal from one of the leads 17 having amplitude or value over time. The analog electrical signals are converted by the acquisition device 15 into digital data format. The computer system 12 stores the received data in its memory (RAM), and may also store the data in a file in memory (hard drive or optical drive) of the computer system for archival storage or for later non-real time rendering of the signals by the computer system on display 13. The computer system 12 has hardware and/or software enabling acquisition of data from the acquisition device 15 and storage of such data in its memory, as typically provided by the manufacturer of the acquisition device 15 for operating with the acquisition device.

The computer system 12 may represent a personal computer (PC) system, work station, laptop computer, or other microprocessor based platform, which is coupled to user controls 13a, such as a keyboard, mouse, touch screen surface upon the display, or combination thereof, enabling the user to control the computer system 12 operation. Such user controls 13a may be interactive with software on the computer system 12 to provide a graphical user interface on display 13. Although the system 10 of the present invention includes computer system 12, display 13, and user controls 13a, in which computer system 12 has a graphics and video card and software for operating same for interfacing and outputting to display 13 as typical of a PC based computer system, the system 10 may be part of an acquisition and display system 11 with acquisition device 15.

Figure 3:
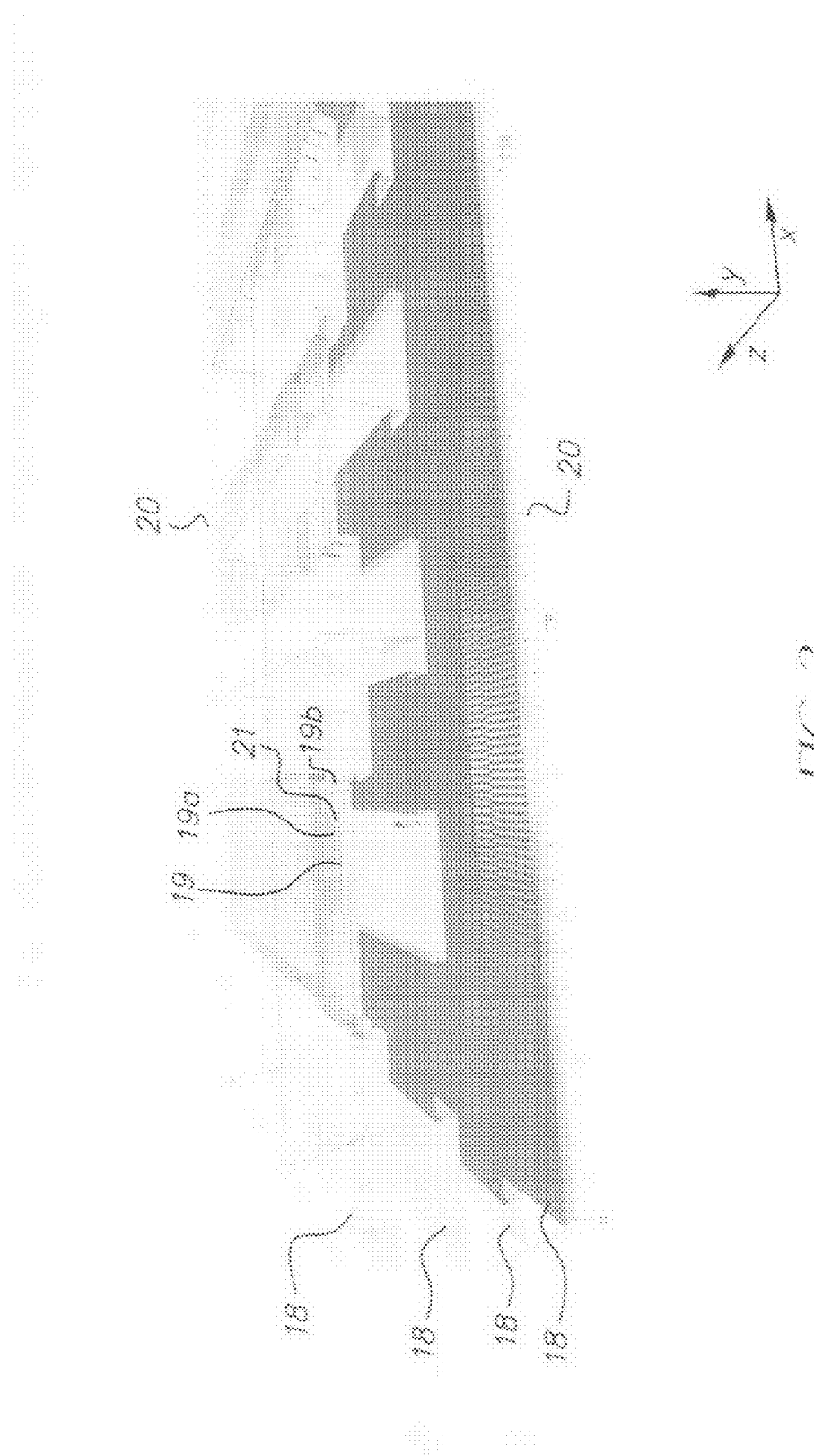
FIG. 3 is an example of the output rendered by the system of FIG. 2 in displaying a three-dimensional view of four channels of electrical signals over time as four three-dimensional continuous or discontinuous surfaces.

The digital data representation of channels of electrical signals received in memory from the acquisition device 15 is processed by the computer system 12 for rendering on display 13. An example output on display 13 is shown in FIG. 3 having four signal channels each represented by three-dimensional (3-D) surfaces 18 to provide a three-dimensional model, in which measurement grids (or scale) 20 represent the time base (x), and the heights along each surface 18 is representative of amplitude or value (y) of the signal. Although the 3-D view is illustrated as being along the entire screen of display 13 in FIG. 12, the view may be in a window on display 13 and may have a control panel of FIG. 50. As will be described in more detail later, for each channel the computer system 12 segments the data in accordance to pre-defined or user defined start and/or end conditions of each segment, orders the segments in accordance to predefined or user defined conditions, and renders on the display each of the segments as line(s) having variations in height (y) in accordance with the values of the data of such segment in their order in depth (z) along a three-dimensional perspective (x, y, z) with gaps between adjacent segments, and then from each of the segments extends three-dimensional planes from each of the line(s) to the next segment in depth (z). For example, the third segment 19 of the topmost surface 18 is denoted by lines which varies (falls and rises) in height (y) along time (x), and for each part of such lines having the same height (y) a three-dimensional plane 21 is extended in a gap 19b to abut lines of the next segment 19a in depth (z). Each segment of a channel on the display forms one ribbon of surface 18, and the combination of such ribbons forms a continuous or discontinuous surface 18. In one example, depth (z) in the perspective of a channel surface 18 relates to previous acquisitions of the channel, thereby enabling a view where a user can analyze the relationship of two or more different channels by their respective surfaces 18 along the relative time base (or scale) 20 over a series of independent acquisition of such different channels. As will be shown below in FIG. 12, the user may add three-dimensional planes at particular times along the time base through different channel surfaces 18 to assist in the analysis.

The data representing multiple channels of signals may be from the acquisition device 15 in real-time (e.g., streaming), but may also, or alternatively, represent a mathematical simulation, or data stored file in memory (hard drive, optical drive, or other memory storage device) of computer system 12 that is not acquired in real-time from acquisition device 15, volatile (RAM) memory or FLASH drive, or any other system or acquisition device 15 capable of producing a set of acquired signal data other than from acquisition device 15 that is connected to computer system 12. This enables system 10 to be portable or stand-alone as well as part of a complete acquisition and display system 11 with acquisition device 15.

Referring now to FIG. 4, the software operating on the computer system 12 for generating the three-dimensional surfaces 18 is shown having modules or software components 14, 22, 24, 26, and 28: user interface 14, segment controller 22, three-dimensional model (3-D) generator 24, model enhancer 26, and model visualizer 28. The model visualizer 28 interfaces with software and/or hardware 32 of the computer system 12 to render and animate the model on display 13 to produce the desired scene, while the user interface 14 allows the user to control the visualized output on the display by changing parameters to modules 22, 24, 26, and 28 in response to user input from user controls 13a. Each of modules will now be described.

The segment controller module 22 receives data 17a representing one or more separate channels of signals from acquisition device 15 and places it in a historical data store in memory of the computer system 12. The segment controller 22 then uses the set of new and/or historical data to generate individual time-contiguous segments containing samples for each of the channels and arranging them into a two-dimensional array of data at the same time. The combined segment array of multiple channels may be considered a matrix. The exact format of such data is not restricted to a single representation.

Figure 5:
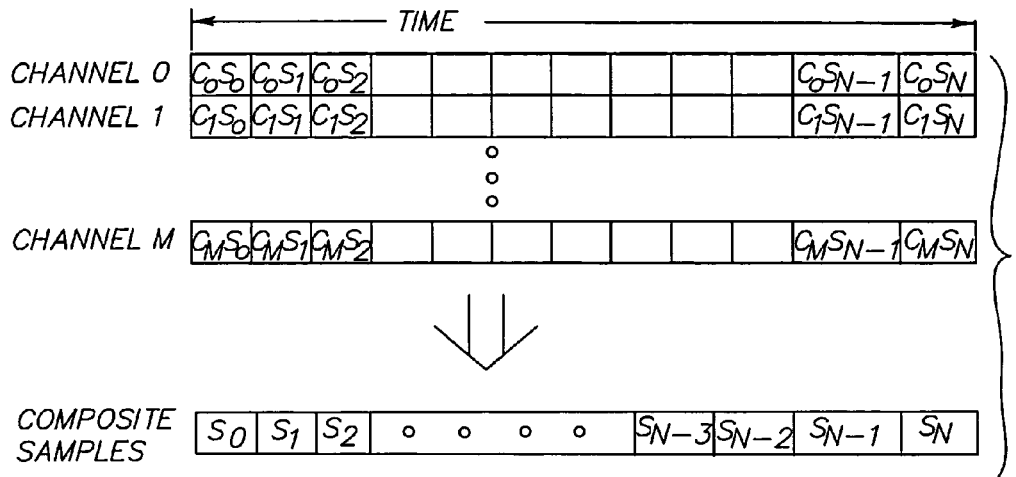
FIG. 5 is an illustration showing an example of how the sequence of samples used to generate segments by the segment controller module of FIG. 4 are composite data samples representative of samples from all the individual channels from the same point in time.

Segmentation is performed on all available channels in parallel so as to maintain all time relationships. As such, the samples used for purposes of segmentation, and the samples in the generated segments, may be considered composite samples whereby the composite sample contains the complete data of each of the included channels samples from that same point in time. This is represented in FIG. 5 where Channels 0 to M ($C_0$-$C_M$) each containing samples 0 to N ($C_0S_0$-$C_MS_N$) containing an amplitude or value (y) along time (x) are operated upon by the segment controller module 22 as a set of composite samples $S_0$-$S_N$ (e.g. $S_0$ contains the data of $C_0S_0$-$C_MS_0$).

A representation of the segmentation of data of multiple channels into segments is shown in a basic case in FIGS. 6A and 6B and in a more general case in FIGS. 51A and 51B. The data for each channel may be segmented along user selectable conditions such as: consecutive time slices, reoccurrence of a pattern, specific start and/or stop conditions, acquisition source, different acquisitions, or combinations thereof. For example, the user selectable condition may be a pattern, such as a switch from low to high or high to low, or a particular sequence of data values. The segments may be uniform or non-uniform in length (x).

FIG. 6A shows an example of segmentation of a set of composite samples, containing data for one or more channels, into five segments labeled A to E in length (time) in FIG. 6A, in which one or more amplitudes or values (y) are shown by boxes along time (x). A two-dimensional array of this data ordering the segments A-E of FIG. 6A in depth z is shown in FIG. 6B. As more data of the represented channel(s) is acquired it may be segmented and added to the bottom the array shown in FIG. 6B. Although the segments are shown non-uniform in FIGS. 6A and 6B the segments may also be of uniform length (time). The organization of the array in two dimensions may be different than shown, and the particular data structure and organization is not limited to that shown in FIGS. 6 or 51. Other segmentation of signals will be discussed latter in connection with FIGS. 52-57.

To setup the system 10, the user interface 14 provides the user with one or more screens on display 13 that enables the selection of parameters, such as selecting which of the available channels the user desires to view, the layered order of such channels, the maximum number of segments of each channel to be extracted and rendered in the view (e.g., 1 to 100), and start and/or stop conditions by which each channel will be segmented, such as described above. The user can further select, via the user interface 14, the color of each channel to be rendered, shading to be applied, and the degree or level of translucency of each channel. If desired, the user can also add non-signal objects to the view such as one or more reference markers (at chosen times (x and/or z)), measurement grids and reference planes (at preset times (x and/or z)), and furthermore can adjust the color and translucency of such additional objects. These parameters may be set to predefined default levels if the user does not wish to select user defined parameters. The user interface 14 may use graphical user interface elements, such as menus, input fields, and the like, typical of a software user interface. Other means for entry of these parameters may be used, such as buttons or knobs along a housing having the display 13, where housing includes the computer system 12, to select one or more of these parameters with or without a graphical user interface on display 13.

First, the two-dimensional array 23 of data containing samples composed of one or more channels, is input to the three-dimensional model generator 24 (FIG. 4) to transform the data into a digital 3-D signal model. The operation of three-dimensional model generator 24 is shown in FIG. 7.

Based on user or default settings, the computer system 12 selects a depth (number of segments) of an input buffer in memory of computer system 12. The three-dimensional model generator 24 separates the 2D array of composite samples into individual 2D arrays (step 34), one for each channel and then filters out (removes) any undesired channels (as specified by predefined or user defined conditions) not to be displayed (step 35). This reduces the amount of data that must be processed by the subsequent functions to only that requested by the user. The model generator 24 uses the number and order of the channels, and the maximum number of segments, as selectable by the user via user controls 13a to user interface 14.

Figure 7A:
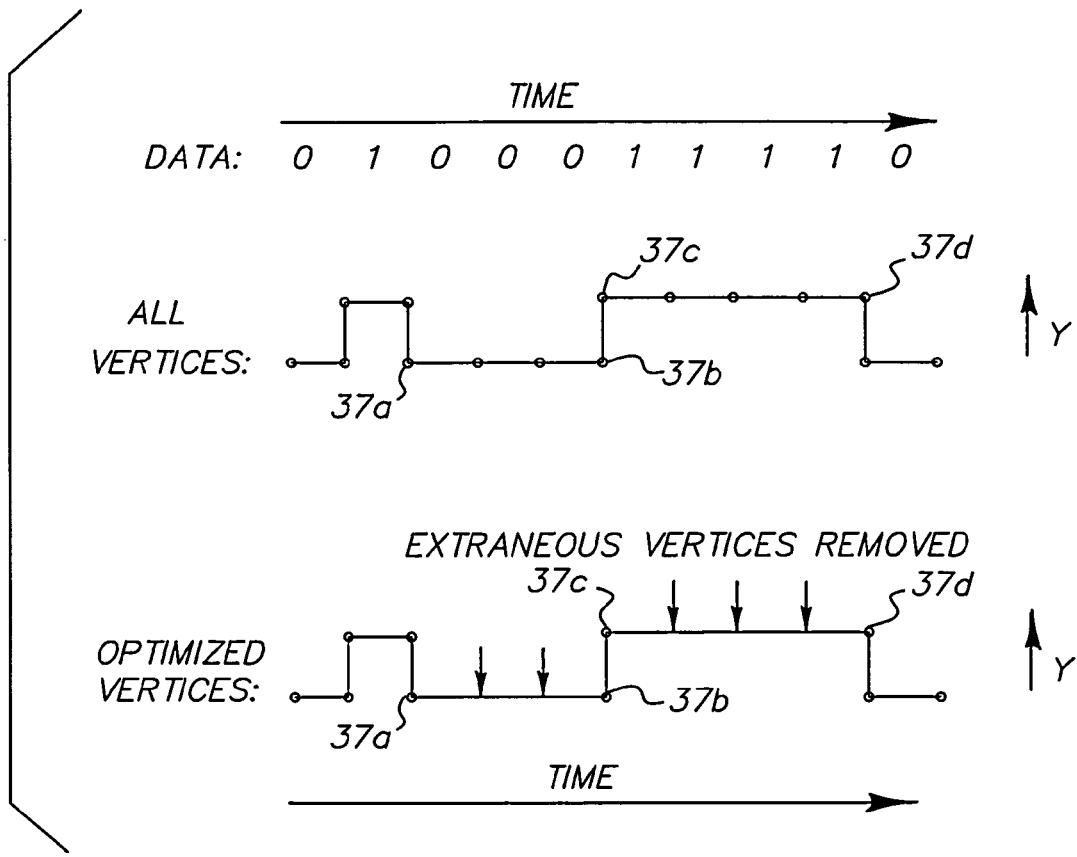
FIG. 7A is an example of the operation of step 38 in the flow chart FIG. 7.

The sample data from individual channels are individually located within a y portion of the three-dimensional space. For each N number of 2D arrays of channel data steps 36-44 are performed within the y portion assigned by the computer system for that channel. Based on the x and z indices of each sample within the array for that channel, a respective location on the x-z plane of the model is calculated (step 36). It is very common when sampling a test point to have a series of time-contiguous samples of the same value. Therefore, in a preferred embodiment the process reduces the workload of the system by eliminating extraneous points that do not describe changes in the signal level over time (step 38) as is shown in the example FIG. 7A. This is done so far as is possible without any loss of information. In the FIG. 7A example vertices or points between vertices or points 37a and 37b, and 37c and 37d, are removed as indicated by arrows between such vertices. Thus step 38 provides for optimization, whereby extraneous vertices that do not represent change in the value of the signal are removed for efficiency in processing and rendering. Although preferable, step 38 may optionally be removed.

From the remaining planar points a y value is then calculated for each to create a location in 3-D space (step 40). The y value relies on two components. Each channel is given a minimum and maximum y value in the model space within which all related samples will be located. The specific values for this y range are for presentation and clarity purposes to provide separation from the other channel surfaces 18 when rendered. In a preferred embodiment these are configurable by the user, as desired, and would not preclude the ability to overlap the locations of separate channels in the same space. The second component in generating a y value for each sample is the stored value associated with it, e.g., voltage of the given test point at that time. The final y value for the point is calculated as a location within the channel's y range which is proportional to that samples value in regards to the maximum value that can be represented for that channel based on the input source. A representation of the x and z location of each entry in the array of FIG. 8A, and the height y at such location, is shown in FIG. 8B.

Those 3-D points that are contiguous in time for each given channel are then connected by lines (step 42). In one specific embodiment this is accomplished by using vertical and horizontal lines to generate a digital representation by forming right angled 'steps'. In another embodiment direct angular lines are created to represent interpolation of the signal value between samples. This is useful for example if the source was an analog channel. Furthermore, multi-bit samples or combinations of multiple channels may be represented by bus symbols rather than a basic line. In any case, the user via the user interface 14 may select the desired form of presentation. A representation of the lines connecting contiguous points in time for each ordered segment 19 is shown in FIG. 8C for the example of FIGS. 8A and 8B, in which each pair of adjacently rendered ordered segments 19 is rendered with a gap 19b (or space) between them for rendering of planes as will be described below.

While connected lines are useful in a two-dimensional graph, they are extremely difficult to understand in a three-dimensional environment as a line is not a three-dimensional object and has no volume. To provide depth, lines are extruded or extended in the z dimension (step 44) in the three-dimensional perspective to form planes 21 along gaps 19b, where common y values contiguous in time (x) along the same segment form a plane 21 (x, z), and different consecutive y values in time (x) along the same segment form an orthogonal step (y,z) or a sloped plane 21 (x,y,z). The planes 21 are extruded in depth (z) such that the plane 21 for each segment 19 meets up with the following segment in depth z, thereby joining to provide a three-dimensional synthesized surface 18 for each channel that is easily discernable from different perspectives as shown in FIG. 8D. The lines added at step 44 in FIG. 8D are different from the lines representing the signal of a given channel so as to enhance the perception of depth in the three-dimensional perspective being rendered in FIG. 8D from that shown in FIG. 8C.

Each segment 19 of a channel on the display once rendered one or more lines along x,y axes, with lines along the z axis forming planes 21 extending there from represents one ribbon of a surface 18. As shown in FIG. 8D, common y values contiguous along the same segment 19 and among a series of ordered segments 19 along the x axis may form (or appear or rendered as) a common plane 21a (x, z), and different consecutive y values along the same segment which are common among a series of ordered segments 19 may form a common orthogonal step (plane) 21b (y,z) or a sloped plane 21 (x,y,z). In other words, the edges of two or more adjacent planes of a channel that are located along the same two of the three-dimensions (x, y, z) they may appear joined to each other as a common plane, and when two planes meet along different ones of at least two of the three-dimensions such two planes appear to meet to form an edge.

For the purpose of illustration, surface 18 in the example of FIG. 8D is discontinuous between some of the planes 21 providing a discontinuous surface (see for example opening 21c between five rendered planes, or openings 21d and 21e). Depending of the values of the segments being rendered, the surface 18 may be continuous. Further a discontinuous three-dimensional surface 18 may optionally be made continuous by rendering additional three-dimensional planes along such discontinuities, such as in openings 21c, 21d, and 21e, and other openings where no rendered planes have edges adjacent to each other.

Other representations of surface 18 synthesis from data are shown for example in FIGS. 9A-9D, and FIG. 10. As shown for example in FIGS. 9B and 9D, the surface may be form angular planes, or from a combination of angular and non-angular planes. This method is particularly useful when the given channel being represented is derived from analog data instead of digital.

Performing the process of FIG. 7 on each of the channels in parallel creates a series of surfaces 18 which, distributed on the y axis, combine together to form a layered three-dimensional view, as shown for example in FIG. 11. In the resulting three-dimensional view, the representations of same-time samples from different channels are fixed relative to each other in the x and z dimensions. Thus, the time relationships amongst elements of the channel surfaces 18 remain clear while still allowing the simultaneous display of multiple channels to the user. Furthermore, once the view of the layered surfaces 18 is shown on display 13, the user controls the three-dimensional perspective, as will be shown later, to enable the user to view down the z axis of the surfaces 18 for each channel and thereby visualize variation patterns over a deep quantity of acquisitions or cycles (i.e., segments up to the maximum number of segments specified by the user).

In a preferred embodiment, a history FIFO of acquisitions, or data segments, can be used to place new data at the front of surfaces 18 and fluidly "scroll" older acquisitions (or data segments) away from the user along the z axis in real-time. In other words, when each channel has additional (or newer) signals, the ordered segments 19 rendered on the display 13 for such channel advances in the depth (z) in the three-dimensional perspective as the computer system 12 continues to segment the data representing the signal of the channels into segments 19 which are then added to the surface 18 of such channel as a new ribbon to such surface 18. Consequently, as each channel advance in depth with the addition of new ordered segments, ribbons of the surface 18 associated with the oldest segments at the back of the surface 18 (i.e., greater than the maximum number desired by the user) may be removed from the view. Thus, a smoothly flowing view of multiple signal channels in a three-dimensional view is provided, whereby newer to older segments of each signal channel are viewable as a flowing surface 18 in a perspective of depth with the surface modifying its shape as values (y) of the signal changes among consecutive ordered segments. This creates an advantageous effect whereby the user can watch trends and cycles in signal timing by taking a perspective view down the depth of the three-dimensional view. Further, data segments which form an array 23 for one or more channels may be stored before, after, or concurrent with rendering on display 13 in memory of computer system 12 or external memory device accessible for storage by computer system 12, and thereby provide an archive for later display of such segments for analysis.

In another embodiment, the three-dimensional model generator 24 may generate multiple three-dimensional models 25a views in parallel. These additional views are generated from decimated copies of lower resolutions of input data 17a by segment controller 22 as array data 23a, and result in simplified versions 25a of the base model 25. These are then used later on by the model visualizer 28 to improve rendering efficiency and increase the volume of data that can be displayed at once while retaining responsiveness to the user and higher update rates of renderings on the display 13, as will be described further below.

Thus, the 3-D model generator 24 receives the two-dimensional array of data 23 for one or more signal channels, and translates it into a three-dimensional model representation where the signal voltage amplitude and time are used to give each sample volume and location in three dimensions (x, y, and z). This produces a complete model where individual channel are viewed as 3-D surfaces 18 layered relative to each other in three-dimensional space over a common time (x and z).

The resulting model 25 is a record in memory (RAM) of the computer system 12 for all the channels to be rendered in a view of vertices in x, y, z space. For example, the record has for each channel the vertices of each segment (such as represented by FIG. 8B) in an order (e.g., left to right) defining lines between vertices (such as represented by FIG. 8C), and the vertices in an order (e.g., top to bottom) defining the planes or surfaces between segments (such as represented by FIG. 8D).

Once the input sample data has been generated into a three-dimensional model 25 (such as shown for example in FIG. 11), the model is enhanced to improve its usefulness to the user by the model enhancer 26. In a preferred embodiment most if not all of these enhancements are under the control of the user by controls 13a to enable and configure as best suits their needs via the user interface 14. In order to clearly identify channel surfaces 18, a different color is applied to each surface 18, as selectable by the user via user interface 14. Furthermore, the area of planes 21 of a ribbon between adjacent samples is applied with a gradient, where the shade of the color approached at each sample point represents the voltage value at that same point. In this way variances in voltage and samples of the same value become more visually apparent. Thus, height and/or one or more of color or intensity of each surface 18 is associated with values of data associated with the surface. Each surface 18 thus preferably varies in one or more characteristics (e.g., color, intensity, shading or gradient) to distinguish the surfaces representing different channels from each other, to distinguish different planes of the same surface 18 from each other, and to distinguish the area of each planes from each other of same surface 18.

In addition to color, the user, via the user interface 14, is able to configure surfaces in the model to be applied with varied degrees of translucency. This, combined with a 3-D vantage point, enables viewing one surface 18 through another of the same or through multiple layered surfaces 18, and provides the ability for one pixel on the screen to give the user information on the value of multiple samples at once. Viewed from above and down along the direction of the y axis this ability can be used to make asynchronous data between two or more channels instantly apparent. Such capability is not possible with the conventional logic analyzer software for displaying two-dimensional signals of multiple channels.

Further, individual samples can also be further enhanced in the 3-D model with particular color, translucency, outlining, the appearance of glowing, or other special graphical characteristic effects as to provide for highlighting of desired points. These enhancements are applicable based on a specific sample, or samples meeting given user criteria such as value. Furthermore, sequences of samples can similarly be highlighted based on a certain sequential pattern or variance in either the x or z dimensions. The user controls 13a to interface 14 may enable the user to select desired value(s) or patterns within a channel to be highlighted by desired graphical characteristic(s).

To facilitate usefulness for analysis, non-signal objects are added to make the 3-D model. These objects include references planes 46a, 46b, and 46c that give scale and alignment information about the samples or identify special locations, such as grid planes 46a, measurement markers 46b, trigger points 46c, and scale 20. The reference planes may extend through the channel surfaces 18 along the entire depth (z) of the view or less than the entire depth, as shown for example by reference planes 46b. Furthermore these non-signal objects 20, 46a, 46b, and 46c can be customized by the user via the user interface 14 with varying colors and translucencies so as not to be lost amongst or hide the signal data being shown around them. An example of the 3-D model of surfaces 18 on a screen of display 13 is shown for example in FIG. 12 having vertical reference planes 46a, 46b, and 46c with four surfaces 18 representing data of different channels. For purposes of illustration, the 3-D model and their associated surfaces 18 shown in the figures are shown in gray-scale, but typically each surface 18, scale 20, and reference planes 46a, 46b, and 46c are of color as described herein.

As mentioned earlier channels may be representative of digital or analog sources or a combination thereof. To accommodate the given source domain channel surfaces 18 may be rendered in an analog form or digital form based on user selection. An example rendering of mixed analog and digital channels in a front-on orthogonal view is shown in FIG. 12A, while an example of mixed analog and digital channels with three-dimensional perspective is shown in FIG. 12B. Fundamentally there is little difference between analog and digital herein and all of the features described herein apply to both forms.

The earlier described record defining model 25 is modified by model enhancer 26 to add a number (or code) for each vertex defining its color and translucency level. For example, this number may have four values (R, G, B, α), where the first three define the R (red), G (green) and B (blue) values, respectively, that describe the color (or color mixture) of the vertex, and the fourth byte, is a value (α) is the level of translucency of that vertex of the color in accordance with its R, B, G, values. For example a completely opaque pure white vertex can be described as (1.0, 1.0, 1.0, 1.0) while a 50% transparent pure black vertex is described as (0.0, 0.0, 0.0, 1.0) and a slightly transparent yellow vertex can be described as (1.0, 1.0, 0.0, 0.9). Further added to the record are vertices defining the non-signal objects (e.g., reference plane(s) 46a, 46b, 46c, and scale 20) and their color and translucency values.

The modified record represents a 3-D display model 27 which is used by model visualizer 28 to produce rendering instructions 29 representative of the visualization of the model 27 to a software/hardware renderer 32 for output on display 13 and thereby produce the desired visual image. First, the visualizer 28 performs scaling of the model 27 in any or all of the three dimensions x, y, z based on predefined or user-defined conditions. This allows the user to condense each axis independently, altering the proportions and the amount of data that is displayed on the display 13. Next, the visualizer 28 takes into account the user's simulated position in the 3-D environment and their viewing angle to determine the portion of model in view. The user controls 13a via the user interface 14 enable the user to input the desired scaling in x, y, z and select any change of simulated user position and viewing angle within or around the three-dimensional model. The change of simulated user position may be performed using buttons on the user interface's keyboard that is coupled to the computer system 12 or clicking (pressing) a mouse button to select where on the image of the 3-D model will be the new viewing position, or clicking down a mouse button and holding down that button while dragging the image to move the position or angle of view about the current viewing position or angle, and releasing that button when the desired view is obtained. Other means of using the user interface 14 may also be used to select or change viewing position and angle, including to top views, bottom views, side views, and any other angular view there between, as desired by the user to view the relationship between two or more channels, or patterns in a single channel.

After the model 27 (FIG. 4) is scaled and the viewing and position updated to the last viewing position and angle in memory of computer system 12 (or a new viewing position or angle as selected by the user), the model visualizer 28 produces rendering instructions 29 for the view to be displayed. The rendering instructions 29 are in a format and code defined by the three-dimensional software/hardware renderer 32 that receives such instructions. The three-dimensional software/hardware renderer 32 is a component of the computer system 12 and has graphics libraries and (optionally) 3-D acceleration hardware to output a three-dimensional image in accordance with such instructions. Such software/hardware renderer 32 enables a fast frame rate and three-dimensional rendering effects, and is often used for video games rendering on personal computers, but has not been utilized in the field of display of test and measuring data. Examples of commercially available three-dimensional software/hardware renderers 32 are commercial video accelerator hardware/software, such as an ATI Radeon or NVidia GeForce series graphics cards and their drivers. The software of model visualizer 28 uses widely available OpenGL software libraries for interfacing to the card. Alternately, the Microsoft DirectX standard or other video graphics library and/or hardware may be chosen.

When using such a library there are common programming techniques that should be applied to achieve better performance. These techniques are well documented in the field of computer graphics and are described in, for example, the publications: OpenGL Architecture Review Board, Dave Shreiner, et al. *OpenGL Programming Guide: the official guide to learning OpenGL version 2. 5$^{th}$ ed.* Boston, Mass.: Addison-Wesley, 2006, or OpenGL Architecture Review Board, Dave Shreiner. *OpenGL Reference Manual, the official reference document to OpenGL version 1.4. 4$^{th}$ ed.* Boston, Mass.: Addison-Wesley, 2004.

Preferably, the model visualizer 28 logically separates the model 27 into sections in the x and/or z dimensions. Based on the viewing angle and virtual distance from the viewer, it then determines each individual section of the view to be displayed and chooses, out of multiple resolution (i.e., decimated) models produced by the 3-D model generator 24 and enhanced by model enhancer 26 which resolution model is most appropriate for each section. Decimated model sections are used when the size on display 13 (related to perspective distance) they are to be rendered at is incapable of effectively displaying additional information in the more detailed version of the model due to the pixel resolution (or other limitation) of the display. In this way, the model visualizer 28 is able to simplify the model without information loss to the user and still greatly decrease the amount of data that must be rendered. For example, a lower resolution representation of arrays 17a are produced by reducing the number of samples in time (x) for each ordered segment, such as by collapsing the set of y values for consecutive N number of samples in the arrays 23a to represent a single y range (max and min) value pair (where N increases as resolution lowers). Each lower resolution representation of the array data 23a is operated upon by generator 24 to produce model 25a and then enhancer 26 to provide different models 27a of model 27 of different resolution for visualizer 28. The visualizer 28 selects the vertices of records for each section of the final view from one of these models 27 and 27a in accordance with time (x and/or z) as the virtual distance from the viewer increases and required resolution reduced. An example of this is shown in FIG. 13 showing three different versions 51, 52, 53, labeled Sections A, B, and C, respectively of the same original data 50 for two signal channels along different parts of a rendered view 49. Although three sections are shown, there are more sections between Sections A, B, and C of different resolution levels of the signal channels.

Model visualizer 28 described above operates asynchronously. This is because the other components 24 and 26 focus on producing a 3-D model and therefore only need to operate when new data is input to the system or the user requests a change in their operation. In addition to when new data is input to the computer system 12, the model visualizer 28 also operates whenever a new image of the 3-D model must be output to the display 13, such as when the user wants to change the view. This approach also allows the model visualizer 28 to also implement animation processes to improve the user experience without requiring continual user input or new data models to be generated.

Figure 14:
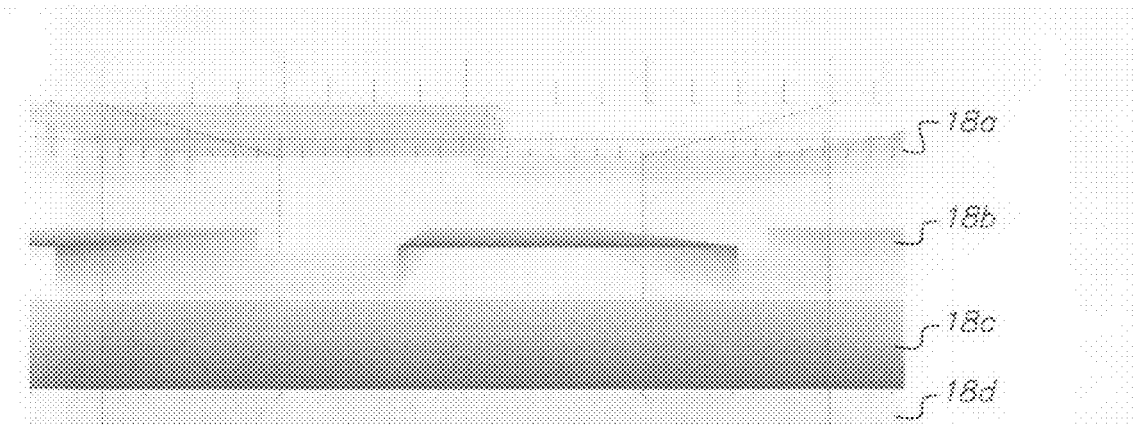
Figure 15:
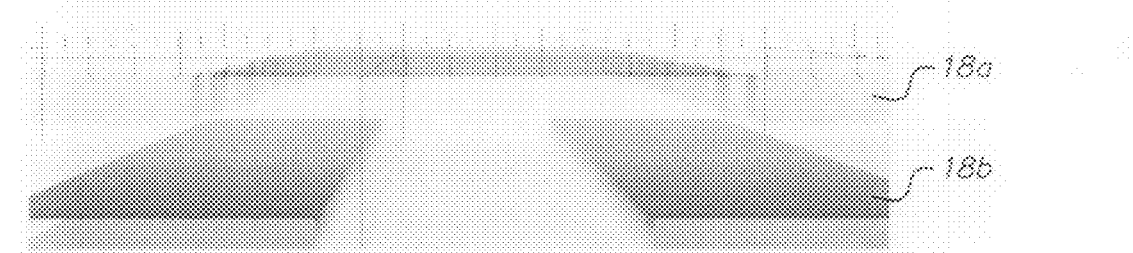
Figure 16:
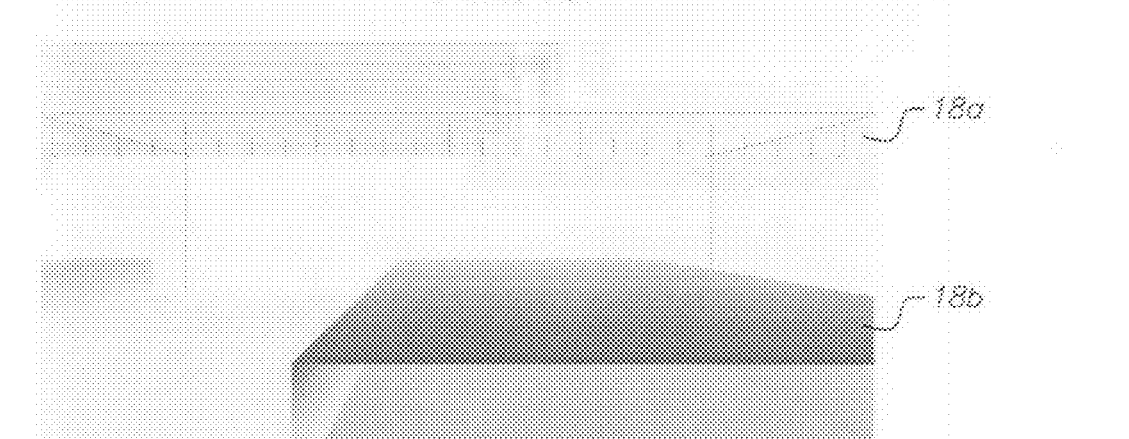
Figure 17:
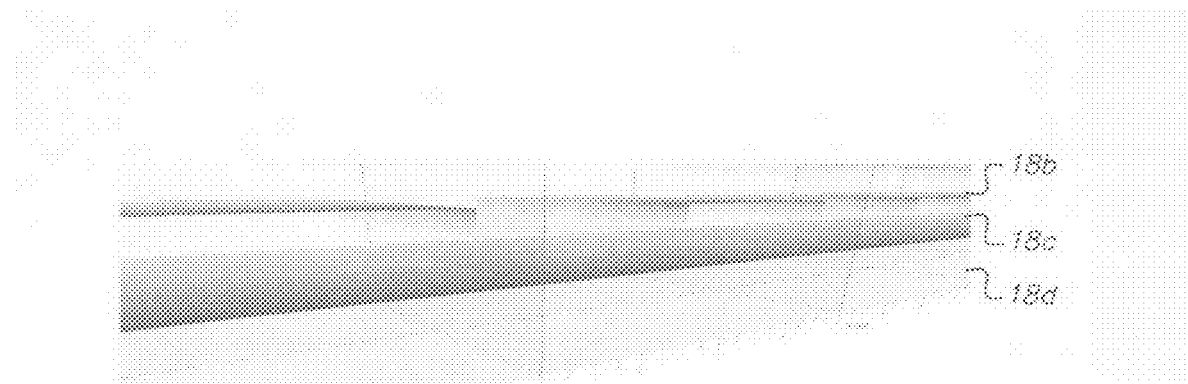
Figure 18:
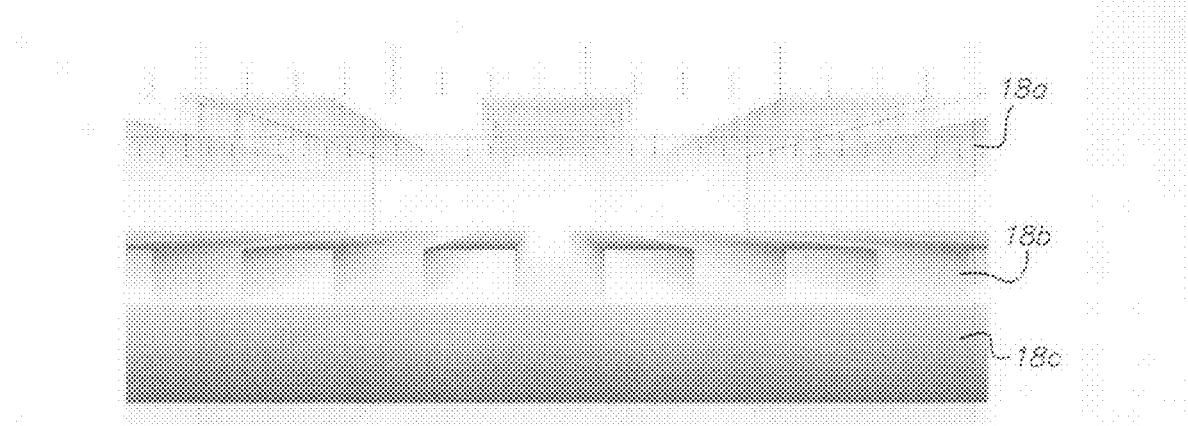
Figure 19:
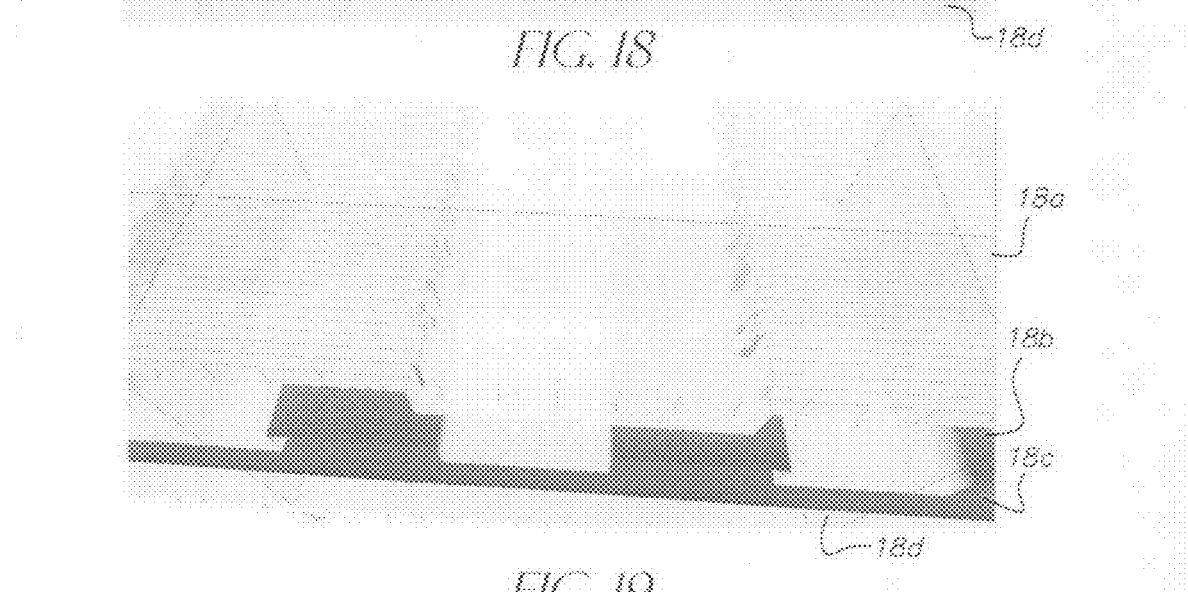
Figure 20:
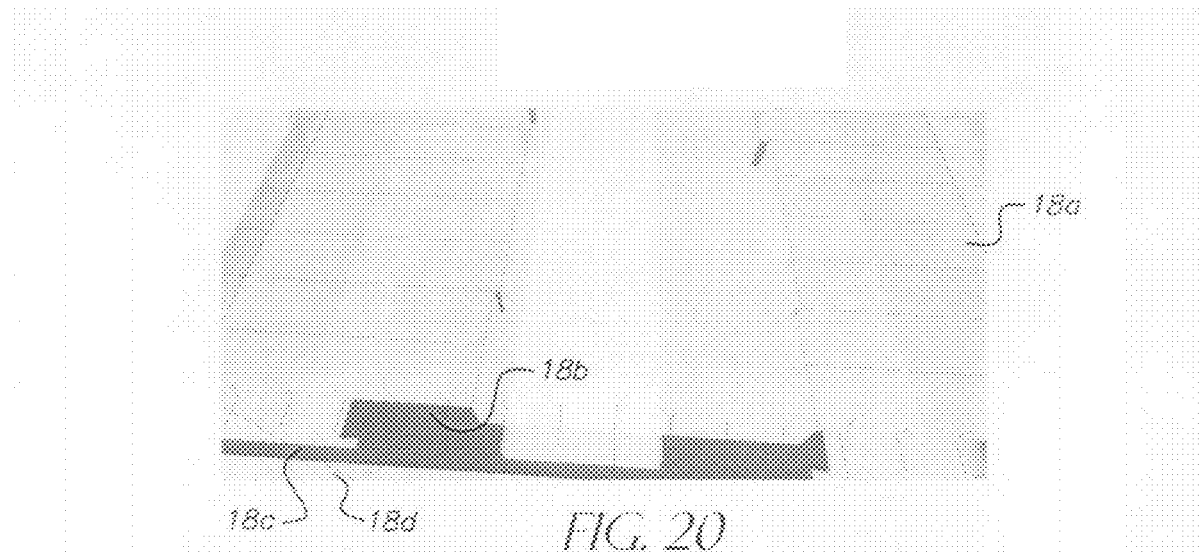

The user interface 14 facilitates the user's interaction with system 10 by user controls 13a. Once a view, such as shown in FIGS. 12 or 12B for example, is rendered on the display 13, the user via the user controls 13a through user interface 14 has freedom of movement within and around the 3-D view of surfaces 18 to select the viewing position and angle of view, as described earlier. This feature is comparable to that normally found in a video game and includes mouse and keyboard control for adjusting the user's X-Y-Z positions, yaw, pitch, and roll, but is not present in conventional logic analyzer or oscilloscope software. This gives the user the ability to view the data from any location around or inside the model quickly and intuitively. A series of examples of the movement of a view of surfaces 18a, 18b 18c, and 18d is shown in FIGS. 14-20. Starting from an original view, such as that shown in FIG. 14, the user can perform the following controls using the user interface's mouse: hold the left mouse button and drag left, right, up, and down to move their view position left, right, up, and down in relation to the current viewing angle (FIG. 15 shows an example moving viewing position up and left from FIG. 14); scroll the mouse wheel forward and back to move the user's viewpoint forward or back (FIG. 16 shows an example of moving viewing position forward from FIG. 14); hold the right mouse button and drag left, right, up, and down to change their viewing angle (yaw and pitch) (FIG. 17 shows tilt of the viewing angle to the right and down slightly from FIG. 14); and hold down the middle mouse button and drag left or right to change the 3-D model's scale in x lesser and greater respectively, as well as down and up to scale the view in y lesser and greater respectively. An example of reducing the x scale from FIG. 14 is shown in FIG. 18.

The scaling axis' change for the middle mouse button drag controls when the user's current pitch and/or yaw angle is greater than 45 degrees. This correlates the adjustment to the model to the predominant direction the user is facing. For example, when the view is greater than 45 degrees down, dragging the middle mouse button up and down will now scale the z dimension of the model instead of the y dimension, as shown in the before and after shots in FIGS. 19 and 20. The surfaces 18a, 18b 18c, and 18d can move in and out of view on display 13 as desired by the user as shown in FIGS. 14-20. The above described use of the mouse's buttons and wheel are exemplary, other mouse buttons, keyboard buttons, or components of the user interface may be used to perform similar or additional functions.

Typically a 3-D view is rendered to a 2-D display, such as a CRT or LCD monitor with perspective; meaning that objects are drawn smaller as their virtual distance from the observer increases. In the case of logic analyzer display software this is not always preferable as it can become difficult to do certain time comparisons of signal data in perspective. This is part of the reason why traditional logic analyzers display their data, including historical data layering, in 2-D graphs. To account for this in system 10, the user may control the amount of perspective used by the model visualizer 28 in drawing the image. This enables the user to switch to and from a completely orthogonal (non-perspective) view which can mimic a traditional two-dimensional (2-D) logic analyzer display when viewed from a perpendicular front view. The user may toggle between views via user controls 13a buttons on a keyboard, or selection on menu, button, or other graphical element on the graphical user interface 14 provided on display 13.

To avoid user disorientation in switching between perspective (3-D) and orthogonal (2-D) views, the model visualizer 28 enables smooth transitions between perspective and orthogonal views (or modes) and back again, thus allowing the user to readily understand the change. Representative frames of this animation are shown in the eight perspective to orthogonal transition screenshots of FIGS. 21-28, where FIG. 21 has the most perspective of surfaces 18e, 18f, and 18g and FIG. 28 is a fully orthogonal view thereof as traces 18e", 18f" and 18g", respectively, and the change there to denoted by version 18e', 18f' and 18g' through FIGS. 22-27. The end result is a 2-D graph where the ordered segments of each channel surface 18 that had been presented in depth extending away from the user, now appear as flatly overlaid on each other in the 2-D graph. The opposite takes place when changing from a 2-D orthogonal view of a 3-D perspective view. Other number of steps may be used to enable smoother transitions between 3-D and 2-D views on display 13.

The smooth transition between 3-D and 2-D views is animated by the model visualizer 28 and relies on basic geometric calculations illustrated in FIGS. 29A-C which are applied to 3-D computer graphics by the model visualizer 28. These methods provide a way to fluidly change the amount of perspective without dramatically changing the current area and focus of channel samples visible within the display model 27 by adjusting both the viewing position and field of view steadily during the transition. This allows the perspective change to occur without disorienting the user or causing undesired side-effects on the resulting render on display 13. A software flow chart of the steps performed by the model visualizer 28 to achieve this automatic animation is shown in FIGS. 30A-B The result is a comfortable and intuitive feel to the user when switching back and forth between these 3-D and 2-D rendering modes.

For example, when the user wishes to change a 36-D perspective view into a 2-D (orthogonal) view they will first select a point of interest (denoted as POI) via the user controls 13a for the user interface 14 on display 13 (step 54). This POI may be any point representative of a data sample or object in the current 3-D rendered view on the display. The user then presses a button on the graphic user interface 14 in the screen on display 13 or a keyboard button to initiate the change to orthogonal view (step 55). The model visualizer 28 on computer system 12 then calculates virtual distance in 3-D space between the POI and the user's current viewpoint or "camera" (step 56). This distance is considered $d_A$. The computer system then determines the angle that is half of the current vertical field of view (step 57). This value is described as $f_A$, also shown in FIG. 29, and is maintained in the memory of computer system 12. The computer system then calculates the virtual spatial distance of half of the viewport (visible perpendicular plane area) height at the POI (defined as H) using the formula H = $\tan(f_A) \times d_A$ (step 58). Next, the computer system uses a discrete number of steps, called N, for the transition to initialize the current step count, called S (step 59). In this example N is 50, but it could be any number greater than or equal to 1. Greater numbers result in a smoother, but longer transition. Additionally a discrete time duration could be used instead, such that the transition occurs over a give time period independent of the number of transition frames that can be rendered by any given system during that time. At this point the model visualizer 28 is ready to begin the transition process. The computer system then updates the current vertical field of view angle so that half of that angle is equal to $(S/N \times f_A)^2$ where the result is called $f_B$ (step 60). The horizontal field of view is also always updated when the vertical field of view changes such that their ratio remains constant. This ratio may be any value predefined by the software. Squaring the stepped angle is used to provide a more linear transition from the user's perspective due to the trigonometric functions. However, any number of other mathematical functions could be utilized to create somewhat varying effects. Next the computer system calculates a new virtual distance between the POI and the user's viewpoint called $d_B$ which is equal to $(d_A \times \tan(f_A) / \tan(f_B))$ and updated in the systems memory (step 61). The viewpoint is moved directly backwards in 3-D space based on its current view direction so that it is at the computed distance. With the new field of view and viewpoint location values calculated, the model visualizer 28 is then ready to render a new scene of the 3-D model (step 62). Afterwards the software decrements S by 1 (step 63). The new value of S is analyzed to see if it is still greater than 1 (step 64). If it is, then the process repeats back to step 60 and continues on again through steps 60-64. Otherwise at step 64, the model visualizer 28 is on the last step of the transition and switches the 3-D graphics library from perspective rendering to orthogonal rendering mode (step 65). Next the computer system uses the previously calculated viewport height H to generate the vertical and horizontal distances around the POI for an orthogonal projection border which is applied to the 3-D graphics library (step 66). Then the user's viewpoint is returned to the original 3-D location it was in at the beginning of the 3-D to 2-D transition process (step 67). Finally, this new scene is rendered with the changed settings and values (step 68), and the change to an orthogonal 2-D view is complete (step 69).

A key feature of rendering of a 3-D view of multiple channels is automated reorientation of the view position and angle. With the freedom of movement provided by a full 3-D environment, the user can select a variety of off-center vantage points with regards to the 3-D view on display 13. Often to provide efficient analysis it is desirable to reorient on a particular point of interest, particularly by achieving a "straight-on" vantage perpendicular to the 3-D view. This is achieved by using the view geometry exemplified in FIG. 31 and the process in the software operating on computer system 12 for enabling automatic reorientation is shown in FIG. 32. Using user interface 14, the user starts from any location, illustrated as "1(Start)" and may click on, for purpose of selection, a point of interest in the 3-D view on display 13, illustrated as "2(POI)" (step 70) and press a button on the graphic user interface 14 in the screen on display 13 or a keyboard button of user controller 13a (step 71) to have the system 10 automatically reorient on that point. As large jumps in rendered views during this transition can be extremely disorienting from the user's perspective, the model visualizer 28 smoothly animates the transition along the dotting line, labeled "3" (FIG. 31) until the perpendicular target vantage point, labeled "4(End)" is achieved. First the software calculates the virtual distance in 3-D between the starting viewpoint and the POI (step 72). This distance is called Dp. Next the computer system calculates the point location in 3-D space (considered Pe) that is exactly Dp distance from the POI perpendicular along either the x, y, or z axis (step 73). The axis chosen is dependent on which button or keystroke the user selected for the desired vantage point. Then the computer system calculates the desired final viewing angle (called Ve) that will result in the POI being in the center of the field of view from location Pe (step 74). The angle Ve will always be 0 degrees from the chosen axis and 90 degrees from the remaining two axis. Next the software calculates the virtual 3-D distance (called Pd) between Ps and Pe (step 75), followed by calculating the angle difference (called Ad) between the starting view angle (called Vs) and Ve (step 76). Once the computer system 12 has calculated the start and end locations and angles using the current position, angle, and the POI, the model visualizer 28 enters a view animation and render loop to perform the transition in small steps until the target endpoint is reached. At this point the software checks to see if the current viewpoint position (called Pc) equals Pe and the current viewpoint angle (called Ac) equals Ae (step 78). If both position and angle are equal to the final desired values at step 78 then the process is complete (step 79). Otherwise the software adjusts Pc to be $1/N^{th}$ of Pd closer to Pe (step 80). N is a discrete number of steps predetermined by the software over which to perform the transition. In this example N is 50, but it could be any number greater than or equal to 1. Greater numbers result in a smoother, but longer transition. Additionally a discrete time duration could be used instead, such that the transition occurs over a give time period independent of the number of transition frames that can be rendered by any given system during that time. Next the computer system adjusts Ac to be $1/N^{th}$ of Ad closer to Ae (step 81). With the new field of view and viewpoint location values calculated, the model visualizer 28 is then ready to render a new scene of the 3-D view (step 82). Then the process repeats back to step 78 and continues from there until the final location and angle are reached. The result is that the model visualizer 28 calculates the necessary movement path and viewpoints, performing the entire process in a smooth transition effect so that the user is able to keep focus on their point of interest and the data around it. This process can be performed to orient the user's position and angle in 3-D space to be aligned perpendicular to the point of interest along any two of the three model axis at a time, as chosen by the user.

Furthermore in a specific embodiment, this reorientation process can be combined with the perspective to orthogonal (or reverse) view transition method described above whereby selecting a point of interest and making just a single click or key press, the user can invoke the computer system 12 to automatically center on the desired vantage point and transition to the desired amount of perspective or lack thereof; resulting in a single automatic and fluid transition such as that shown in the example of a view of surfaces 18*h*, 18*i*, 18*j*, and 18*k* of FIGS. 33-43. This is extremely useful for being able to move around the model in 3-D perspective to locate an anomaly, and then with a single click smoothly transition to a straight-on orthogonal view to perform in-depth analysis of the data and timing around the event. Another click and the user can transition to a traditional front-on view as shown in FIGS. 43-49, thus providing for an efficient and effective usage flow of the instrument. This movement can be performed while remaining in orthogonal (non-perspective mode) as in FIGS. 43-49, or by transitioning back to 3-D perspective during the movement. Surfaces 18*h*, 18*i*, 18*j*, and 18*k* are preferably of different color and have a sufficient degree of translucency to enable discernment of transitions in such surfaces when overlaid as shown in FIGS. 33-48. Surfaces 18*i*, 18*j*, and 18*k* thus may be visible under surface 18*h* and through each other, but Surfaces 18*i*, 18*j*, and 18*k* are not discernable in FIGS. 37-43 due to limitation of non-color presentation.

Referring to FIG. 50, the user interface 14 may include a control panel 84 which may appear on the display 13 adjacent to the main rendered view on the screen of the 3-D surfaces 18 of multiple channels, as shown in FIG. 12, and operated upon using the user interface's mouse of user controls 13*a*. The control panel 84 enables the user to understand the positioning of the viewpoint and signal channels in the 3-D model as well as provide an interface to customize the properties of those channels. This panel shows representations of each channel currently included in the 3-D model. Each channel has a label 85 that can be customized by clicking on it and a graphical representation of the signal 86-92. These are drawn with a color matching that used for the signal in the 3-D model itself. Additionally, the symbols may be located vertically within the panel at a location proportional to the channel's y location in the model, and are therefore not necessarily evenly distributed in area 93 of panel 84. Furthermore the symbols are capable of being dragged up and down by the user to alter the channel's location and the 3-D model is then re-generated accordingly. By clicking on the symbols the user can alter further properties of the channel such as but not limited to: color, transparency, source, height, graphical representation style (analog, digital, bus, etc.), and numerical base (binary, hex, octal, decimal, etc.). If an acquisition device 15 connected to this system is capable of producing live activity information on the current state of the signals, then the channel symbols in the panel are also used to portray this information. These are exemplified in the diagram as signal conditions of; rising 86, low 87, high 88, toggling 89, falling 90, a stable hexadecimal bus 91, and a bus with some of its signals changing 92.

The control panel 84 also contains a camera symbol 94 that represents the user's current viewpoint in the y axis with relation to the 3-D view. Additionally, the angle of the graphic indicates the current pitch of the view 95. In this way the symbol effectively provides useful orientation information, particularly when the point of view is very close to or within the surfaces 18 on display 13 itself and the main view rendering may be too close-up or confusing. Lastly, the camera symbol 94 is draggable in the y axis similar to the signals, such that the user can quickly relocate to a new vantage point of the view of surfaces 18 on display 13.

As described earlier in connection with FIG. 4, the segment controller module 22 segments channels of the data into an array along a z dimension of ordered segments. This array does not necessarily have to be uniform. The z dimensional ordering of a stack of independent data segments may be selected, broken, and ordered based on user defined conditions, whereby each segment is comprised of a set of the time-ordered data. Examples of such conditions are shown in FIGS. 51-57. In the example of FIG. 51, all of the data comes from a single original time-ordered acquisition, whereby segments can be any part of the original set, overlap, vary in size, and skip data. Some preferred uses include choosing segments based on; different acquisitions, consecutive time slices (FIG. 52), occurrence of a pattern (FIG. 53), specific start and/or stop conditions (FIGS. 54-55), data dependent sub-triggers, source device and combinations thereof. In addition, fake or simulated reference segments can be specified by the user and generated for inclusion in the set of segments for the purpose of creating a constant base case or comparison set as shown in FIG. 56 for example. Other selection and ordering of segments may be used Once the data samples contained in each segment are selected, two other factors affect stacking the segments in the z-dimension to create an array of data to be modeled. The first factor is alignment. The first sample of each segment does not necessarily have to be aligned in the x dimension (time), such as is shown in FIG. 51. Alternately, segments could be aligned based on other conditions, such as location of samples matching a specified pattern, end sample, or a specific real-time time differential between segments. The second factor in arranging the segments is order. While the preferred method is to order the segments in the z dimension in increasing real-time order, segments may also be reordered based on such conditions as values in the data, original source, or acquisition. An example of reordering of an array in which segments are ordered in a non-time continuous manner is shown in FIG. 57.

In addition to analysis of test and measurement data, system 10 may be used to analyze domain specific data. One such example of useful analysis that could be assisted by the present invention is video signals where the acquisition device 15 (FIG. 2) samples a video channel from a device or unit 16 under test, or such video signals may be from another source to the memory of computer system 12. Video communications typically include a vertical sync signal that signifies a new video frame and a horizontal sync signal that signifies a new horizontal line of video within that frame. Using these signals as well as the video data itself, the sampled data can be rearranged such that the invention can display a 3-D representation of the live sampled video streaming from a unit under test; such as is represented in the example FIG. 58. To achieve this, the acquisition device's trigger is set up to trigger on a rising edge of the vertical sync line. Additionally, either a hardware sub-trigger or else a software programmed sub-trigger is set for a rising edge on the horizontal sync line. The vertical sync trigger denotes the first segment of the 2-D array to be displayed by the invention, while the horizontal sync trigger would be used to "break" or denote the separation of each segment to be ordered in the z dimension of the array. In this example, the z order would want to place the first segment furthest away and the last segment closest to the front of the model as to mimic a top to bottom scanning of a video frame. Note that this is reversed from the example figure which shows the vertical sync trigger in front simply for demonstration purposes. This is a different mode of operation than an acquisition based z dimension as discussed earlier that would cause a historical aging or scrolling effect. In this case, instead of an aging model that scrolls, the entire model would be updated at once. When a new acquisition containing information for a new video frame is available, the entire model would update again.

The result of such a setup is a full video frame of a time-contiguous acquisition that is then restructured into a 2-D array of data similar to what it actually represents. The system 12 is then able to render it such that the actual complete video frame could be seen along with the control and/or other signals. This is extremely useful for determining the cause of anomalies or static in the video signal as the human eye could easily recognize them in the reconstituted frame. Using the translucency of different channels, the user can overlay the video data with various other signals to determine the cause of the problem. Reference planes 46 may further be added to the rendered display.

Furthermore, the system 10 may be extended for use in analysis of data in non time-ordered domains. For example, the system 10 can render in three dimensions, for purposes of visualization and analysis, a frequency domain representation of some or all of the input data 17a; for example, as resulting from application of a Fourier transform to the data. In another embodiment, the system 10 may render the input data 17a as a probability distribution; for example, as a histogram or other non time-domain representation, though the scope of the invention is not limited to solely those domains and applications specified herein.

Additionally, while the 3-D modeling herein has been discussed in terms of the three-dimensional Cartesian coordinate system (x,y,z), the system 10 may also operate upon input data 17a, or processed derivations thereof, to render 3-D representations on display 13 using non-Cartesian coordinate systems such as: 3-D spherical, cylindrical, or other coordinate systems, similar to that described above using a Cartesian coordinate system.

From the foregoing description it will be apparent that there has been provided an improved system and method for three-dimensional rendering of electrical test and measurements signals, as well as for analysis of video and other applications of signals. The illustrated description as a whole is to be taken as illustrative and not as limiting of the scope of the invention. Such variations, modifications and extensions, which are within the scope of the invention, will undoubtedly become apparent to those skilled in the art.

The invention claimed is:

1. A method for displaying a visual representation of one or more signals for facilitating test and measurement, comprising:
   acquiring a first set of signal values that each represent a measurement of at least a first signal of one or more signals over a period of time; and wherein each said signal value has an associated time value;
   segmenting said signal values into ne or more signal segments in accordance with an ordering of said signal values;
   displaying a three dimensional representation of said first signal over time by displaying each of said signal values with respect to three axes, said axes including a first (X) axis, a second (Y) axis and a third. (Z) axis that are each oriented in a direction that is orthogonal relative to any other said axis; and
   wherein said signal values within each said signal segment are each displayed relative to said first (X) axis in accordance with a time value that is associated with each of said signal values; and
   wherein said signal values within each said signal segment are each also displayed relative to said second (Y) axis in accordance with each of said signal values, and
   wherein said signal values within each said signal segment are each displayed relative to said third (Z) axis in accordance with a location of each said signal segment along said third (Z) axis; and
   wherein a set of renderable planes are constructed and are connected in a series to form at least one ribbon, each of said planes having a surface that is oriented parallel to said third (Z) axis and said ribbon representing one or more signal values during a period of time within a first one of said signal segments.

2. The method of claim 1 wherein said planes are further extended to at least another second one of said signal segments to extend said surface to include multiple ribbons and wherein each of said multiple ribbons represents a respective one of said signal segments.

3. The Method of claim 1 wherein said ribbon is displayed as a translucent ribbon.

4. The method of claim 2 wherein said surface is displayed as a translucent surface.

5. The method of claim 1 wherein said ribbon is displayed as a solid ribbon.

6. The method of claim 2 wherein said surface is displayed as a solid surface.

7. The method of claim 1 wherein multiple signals including said first signal are displayed in a layered order along said second (Y) axis.

8. The method of claim 7 wherein each of said multiple signals are represented by a different color or translucency.

9. The method of claim 7 wherein a first signal is represented by a first color that is a translucent color and wherein a second signal is represented by a second color that is displayed behind said first signal from as current viewing position and wherein said second signal is visible through said first signal when viewed from said current viewing position.

10. The method of claim 9 wherein display of said first signal and said second signal are aligned with respect to time along said first (X) axis and along said third (Z) axis.

11. The method of claim 1 wherein said ordering of said signal values is with respect to a time of acquisition for each signal value and wherein said signal segments are displayed in sequence over time and wherein said location of each of said signal segments advances in depth along said third axis in response to display of a signal segment that is displayed later in time than a time of display of other displayed signal segments.

12. The method of claim 1 wherein a user interface provides a first viewing position from which to view a representation of one or more signals including said first signal, and provides for selection of a different second viewing position from which to view said representation of one or more signals, and wherein a view from said first viewing position is transitioned to said second viewing position via a display of a plurality of viewing positions located between said first and said second viewing positions.

13. The method of claim 12 wherein a level of perspective changes from a first amount of perspective at a first viewing position to a second amount of perspective at a second viewing position via a display of a plurality of viewing perspectives at viewing positions located between said first viewing position and said second viewing position.

14. The method of claim 1 wherein a user can specify any viewing angle in combination with any viewing position.

15. The method of claim 1 wherein a user can specify any amount of perspective for a current viewing position.

16. The method of claim 1 wherein said signal is a digital signal.

17. The method of claim 1 wherein said signal is an analog signal.

18. A system for displaying a visual representation of one or more signal channels for facilitating test and measurement, including:
 a data input component for acquiring a first set of signal values that each represent a measurement of at least a first signal of one or more signals over a period of time and wherein each said signal value has an associated time value;
 a computing component for segmenting said signal values into one or more signal segments in accordance with an ordering of said signal values and for computing a three dimensional representation of at least said first signal over time by representing each of said signal values with respect to X, Y and Z axes that are each oriented in a direction that is orthogonal relative to any other of said axes; and
 wherein said signal values within each said signal segment are each displayed relative to said third (Z) axis in accordance with a location of each said signal segment along said third (Z) axis; and
 wherein a set of renderable planes are constructed and are connected in a series to form at least one ribbon, each of said planes having a surface that is oriented parallel to said third (Z) axis and said one ribbon representing one or more signal values during a period of time within a first one of said signal segments; and said system further including:
 a display component for display of said signal values in accordance with said three dimensional representation.

19. The system of claim 18 wherein a second set of signal values representing a measurement of a second signal is acquired and displayed in accordance with said three dimensional representation.

20. The system of claim 19 wherein said first signal and a second signal are displayed in a layered order along said second (Y) axis.

21. The system of claim 19 wherein different signals are displayed in different colors.

22. The system of claim 19 wherein different signals are each displayed in a. different color or translucency.

23. The system of claim 18 wherein said signal is a digital signal.

24. The system of claim 18 wherein said signal is an analog signal

25. The system of claim 18 wherein said ordering of said signal values is with respect to a time of acquisition for each signal value and wherein said signal segments are displayed in sequence over time and wherein said location of each of said signal segments advances in depth along said third axis in response to display of a signal segment that is displayed later in time than a time of display of other displayed signal segments.

* * * * *